US011145553B2

(12) United States Patent
Ching et al.

(10) Patent No.: US 11,145,553 B2
(45) Date of Patent: Oct. 12, 2021

(54) NONPLANAR DEVICE AND STRAIN-GENERATING CHANNEL DIELECTRIC

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/564,249

(22) Filed: Sep. 9, 2019

(65) Prior Publication Data
US 2020/0006156 A1  Jan. 2, 2020

Related U.S. Application Data

(60) Continuation of application No. 15/805,892, filed on Nov. 7, 2017, now Pat. No. 10,410,930, which is a
(Continued)

(51) Int. Cl.
*H01L 21/8238* (2006.01)
*H01L 29/66* (2006.01)
(Continued)

(52) U.S. Cl.
CPC ........... *H01L 21/823821* (2013.01); *H01L 21/02233* (2013.01); *H01L 21/02532* (2013.01);
(Continued)

(58) Field of Classification Search
None
See application file for complete search history.

(56) References Cited

U.S. PATENT DOCUMENTS 6,800,910 B2  10/2004  Lin et al.
6,882,025 B2   4/2005  Yeo et al.
(Continued)

OTHER PUBLICATIONS

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.
(Continued)

*Primary Examiner* — Long Pham
(74) *Attorney, Agent, or Firm* — Haynes and Boone, LLP

(57) ABSTRACT

Various methods are disclosed herein for fabricating nonplanar circuit devices having strain-producing features. An exemplary method includes forming a fin structure that includes a first portion that includes a first semiconductor material and a second portion that includes a second semiconductor material that is different than the first semiconductor material. The method further includes forming a masking layer over a source region and a drain region of the fin structure, forming a strain-producing feature over the first portion of the fin structure in a channel region, removing the masking layer and forming an isolation feature over the strain-producing feature, forming an epitaxial feature over the second portion of the fin structure in the source region and the drain region, and performing a gate replacement process to form a gate structure over the second portion of the fin structure in the channel region.

20 Claims, 17 Drawing Sheets

Related U.S. Application Data continuation of application No. 15/088,278, filed on Apr. 1, 2016, now Pat. No. 9,837,321, which is a division of application No. 14/451,503, filed on Aug. 5, 2014, now Pat. No. 9,306,067.

(51) Int. Cl.
| | |
|---|---|
| *H01L 29/78* | (2006.01) |
| *H01L 29/06* | (2006.01) |
| *H01L 29/165* | (2006.01) |
| *H01L 27/092* | (2006.01) |
| *H01L 29/10* | (2006.01) |
| *H01L 21/02* | (2006.01) |
| *H01L 21/3105* | (2006.01) |
| *H01L 21/762* | (2006.01) |
| *H01L 21/84* | (2006.01) |
| *H01L 27/12* | (2006.01) |

(52) U.S. Cl.
CPC .. *H01L 21/31055* (2013.01); *H01L 21/76224* (2013.01); *H01L 21/823814* (2013.01); *H01L 21/823878* (2013.01); *H01L 27/0924* (2013.01); *H01L 29/0649* (2013.01); *H01L 29/1054* (2013.01); *H01L 29/165* (2013.01); *H01L 29/66545* (2013.01); *H01L 29/66636* (2013.01); *H01L 29/66795* (2013.01); *H01L 29/785* (2013.01); *H01L 29/7846* (2013.01); *H01L 29/7848* (2013.01); *H01L 29/7849* (2013.01); *H01L 21/845* (2013.01); *H01L 27/1211* (2013.01)

(56) References Cited

U.S. PATENT DOCUMENTS

| | | | |
|---|---|---|---|
| 7,485,520 | B2 | 2/2009 | Zhu et al. |
| 7,564,081 | B2 | 7/2009 | Zhu et al. |
| 8,633,516 | B1 | 1/2014 | Wu et al. |
| 8,901,607 | B2 | 12/2014 | Wang et al. |
| 9,006,786 | B2 | 4/2015 | Ching et al. |
| 9,196,522 | B2 | 11/2015 | Ching et al. |
| 9,543,418 | B2 * | 1/2017 | Ching ............... H01L 21/02236 |
| 2004/0262687 | A1 | 12/2004 | Jung et al. |
| 2014/0120677 | A1 | 5/2014 | Pham et al. |
| 2014/0197457 | A1 | 7/2014 | Wang et al. |
| 2015/0069474 | A1 | 3/2015 | Ching et al. |
| 2015/0206890 | A1 * | 7/2015 | Liaw .................... H01L 29/785 257/391 |
| 2015/0357443 | A1 * | 12/2015 | Ching .................. H01L 29/785 257/190 |
| 2015/0380556 | A1 | 12/2015 | Ching |
| 2016/0043225 | A1 | 2/2016 | Ching et al. |
| 2016/0155846 | A1 | 6/2016 | Chen et al. |

OTHER PUBLICATIONS

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.

U.S. Appl. No. 61/984,475, filed Apr. 24, 2014, "Structure and Method of FinFET Device," 29 pages of text, 17 pages of drawings.

Office Action dated Feb. 18, 2016, issued by the Korean Patent Office for Patent Application No. 10 2014 0192620, 12 pages.

* cited by examiner

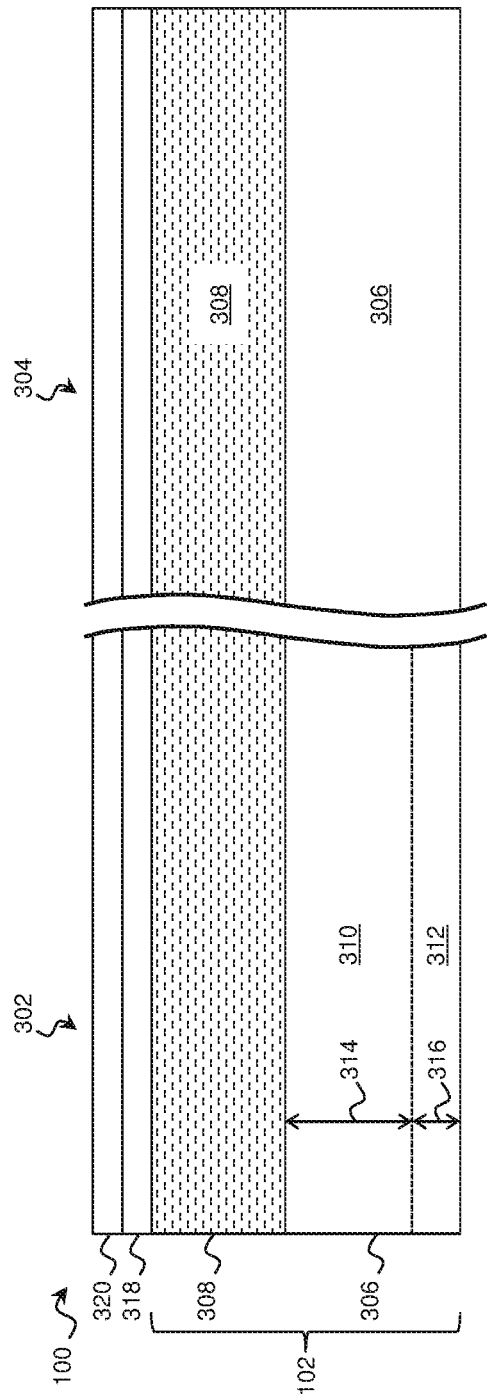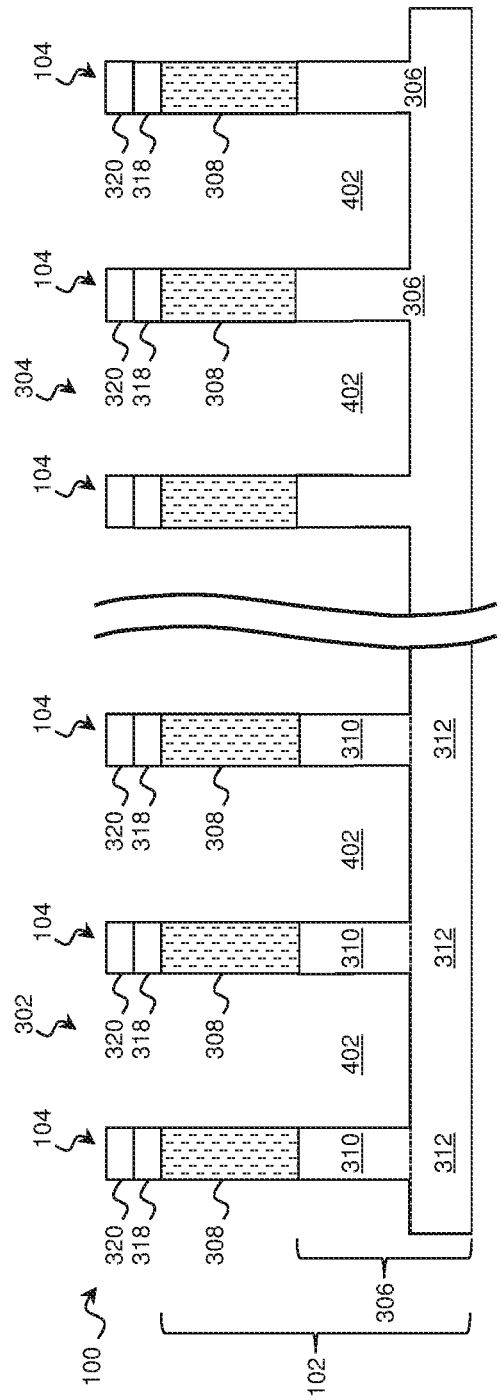

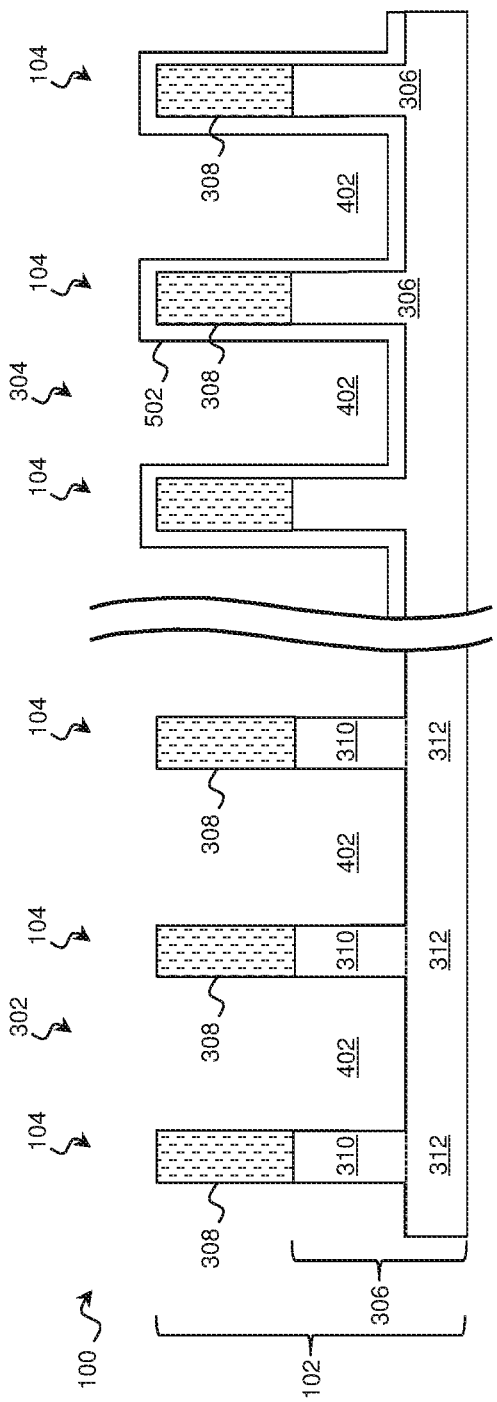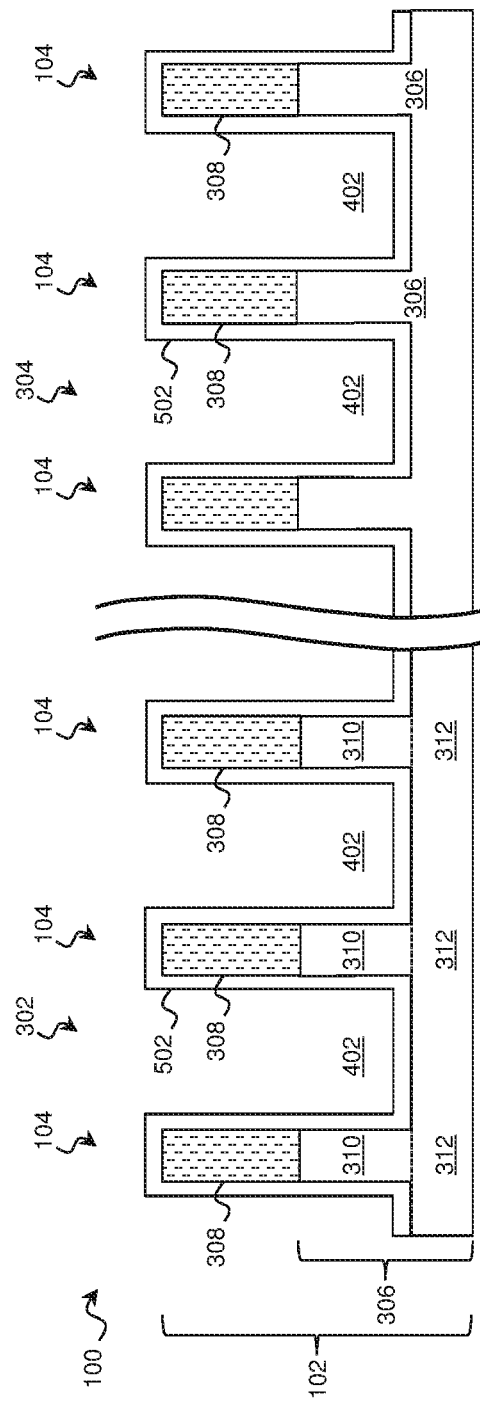

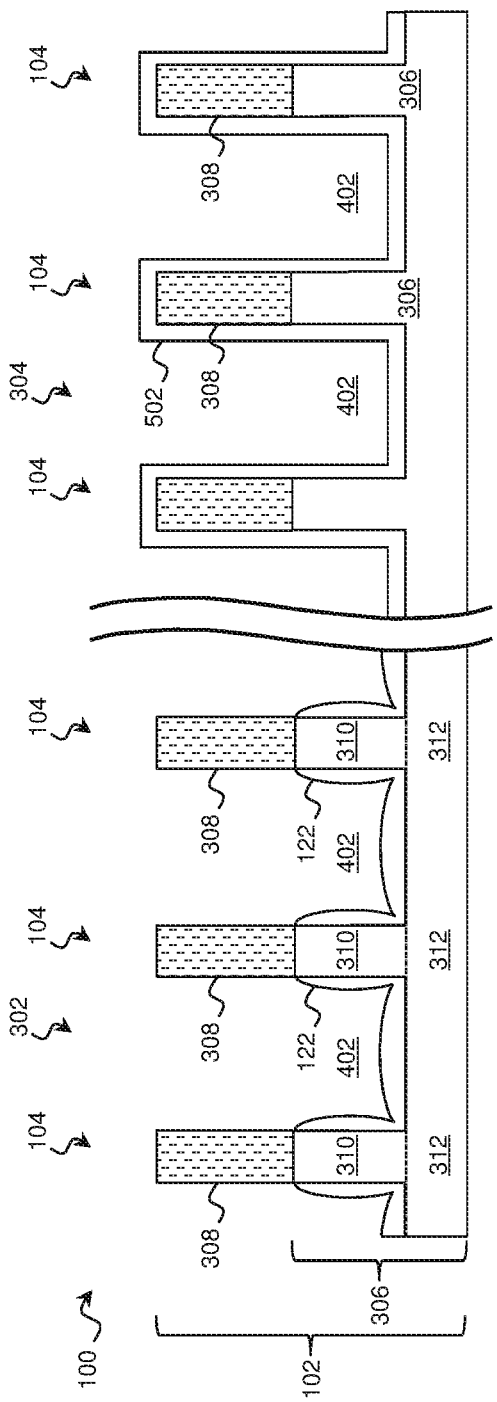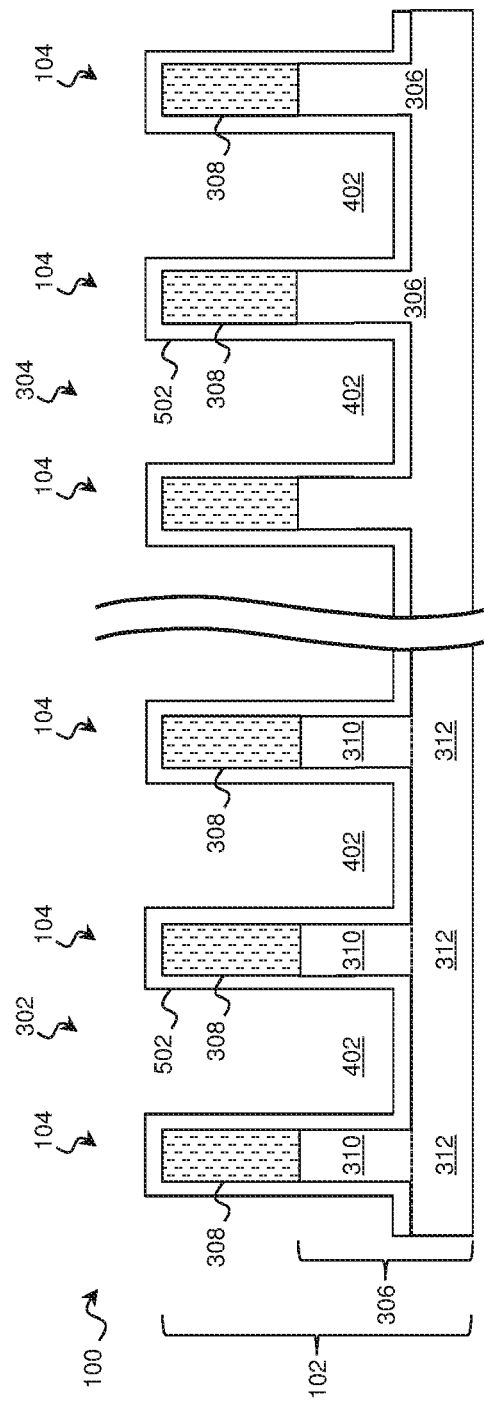

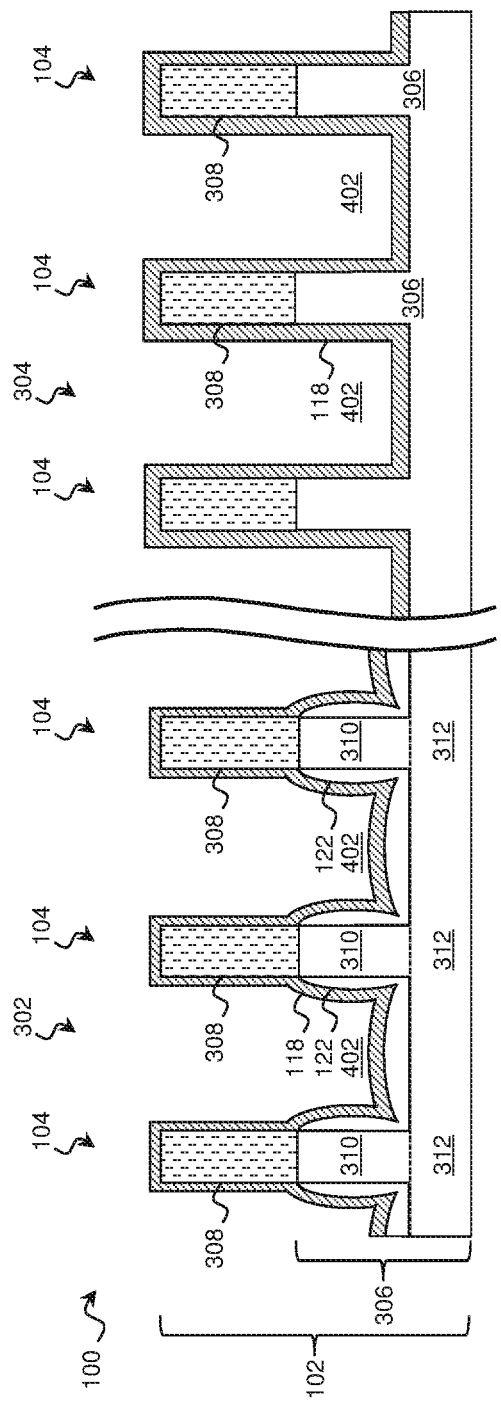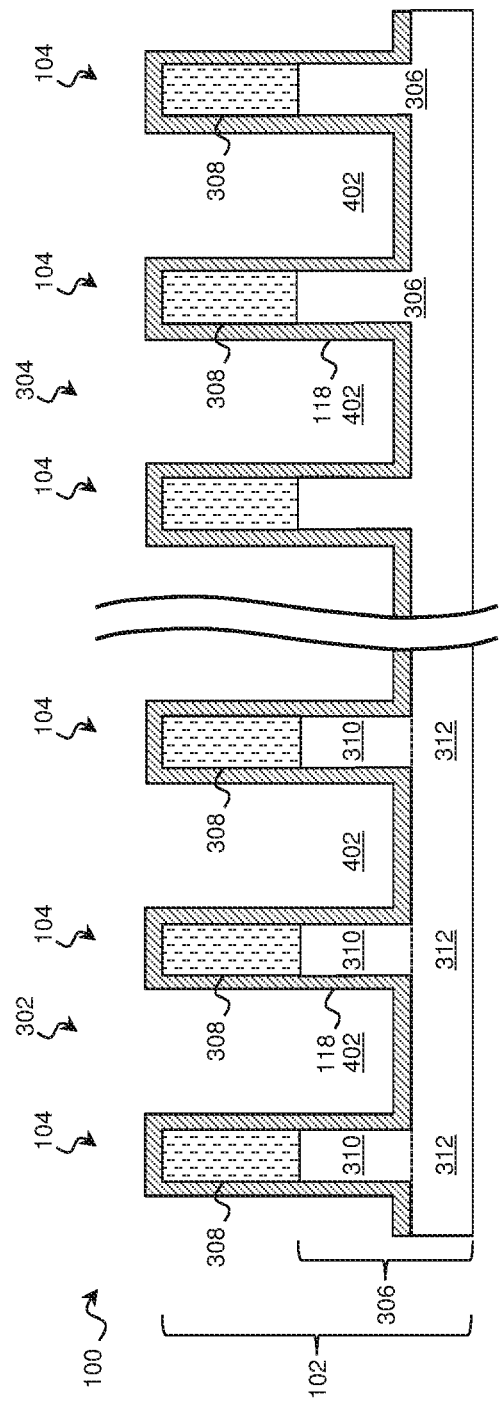

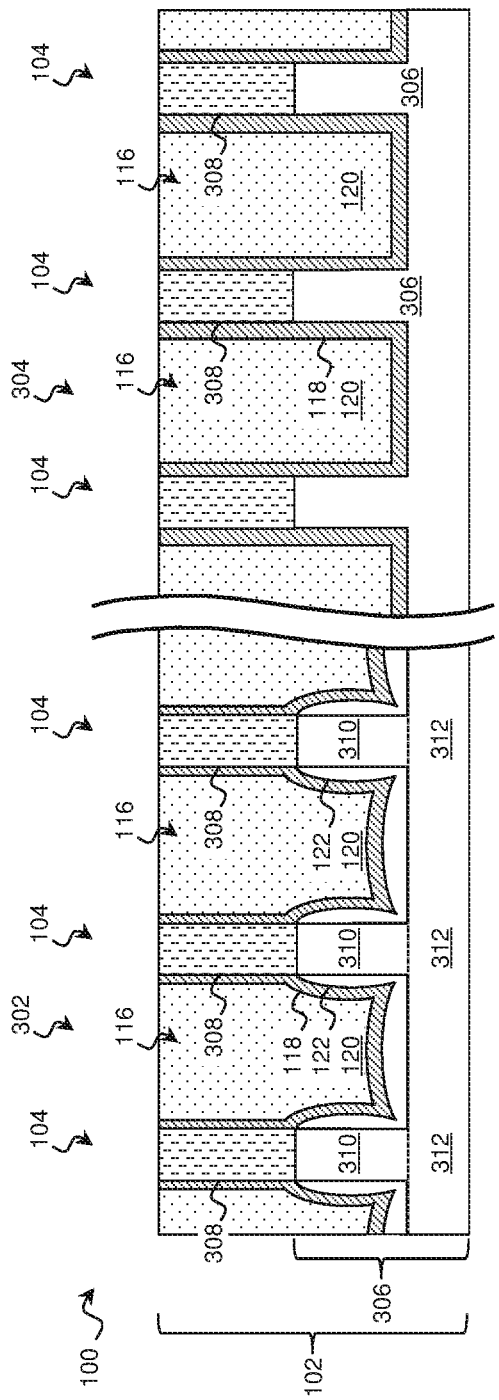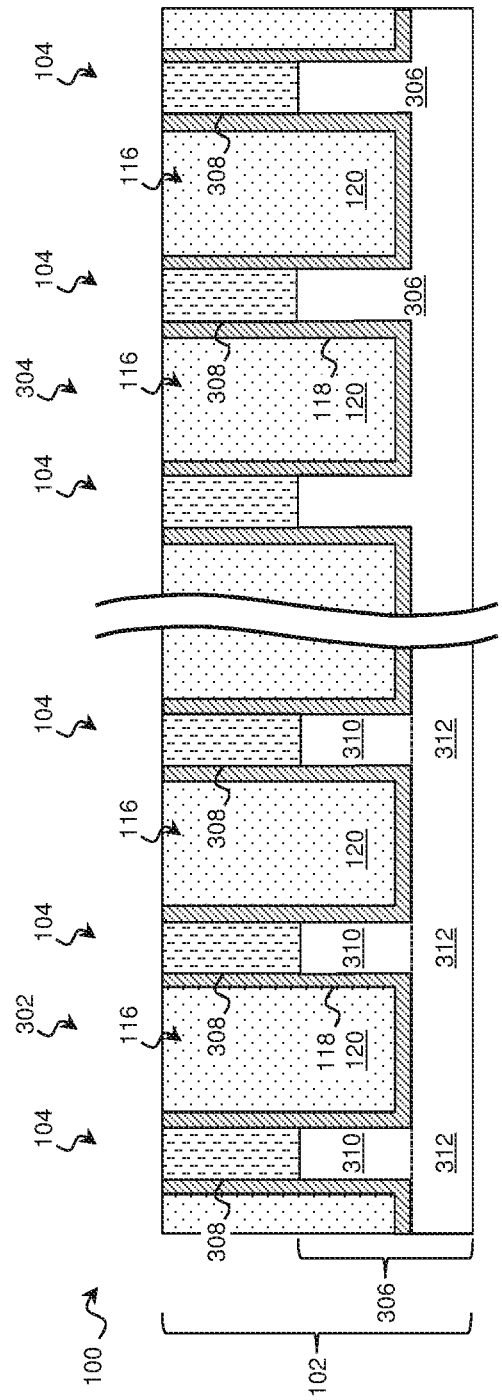

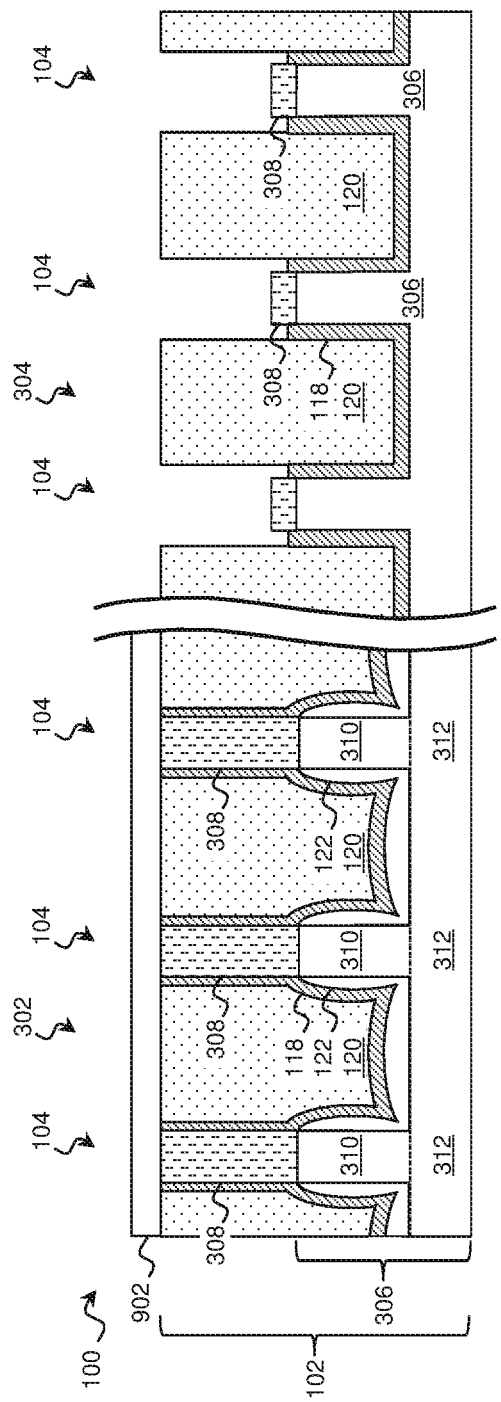
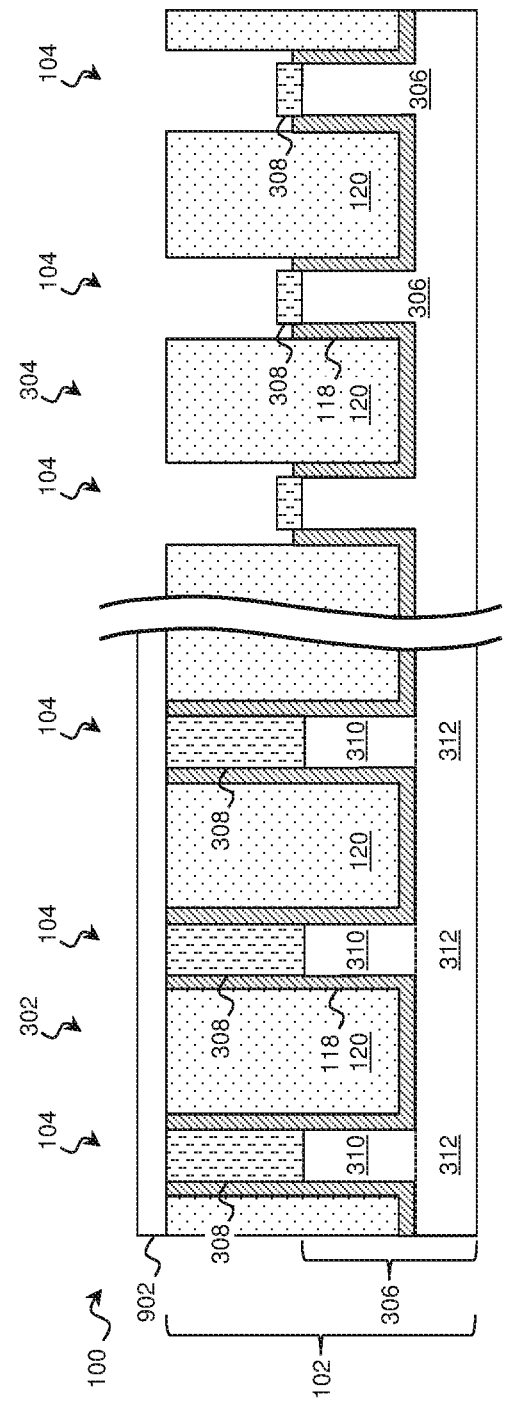
Figure 9A
Figure 9B

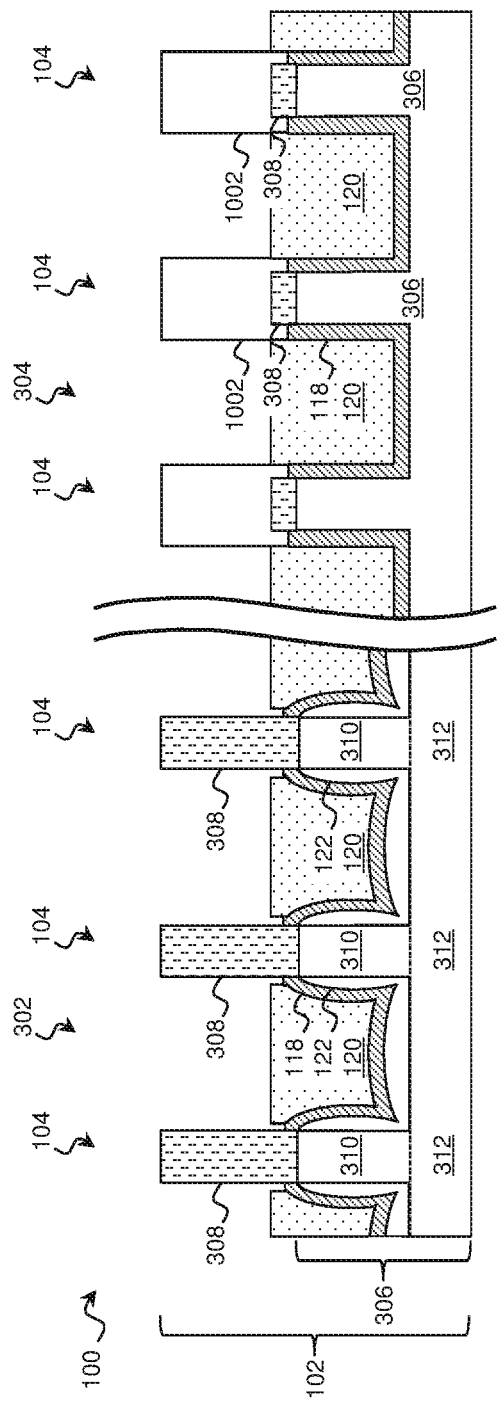
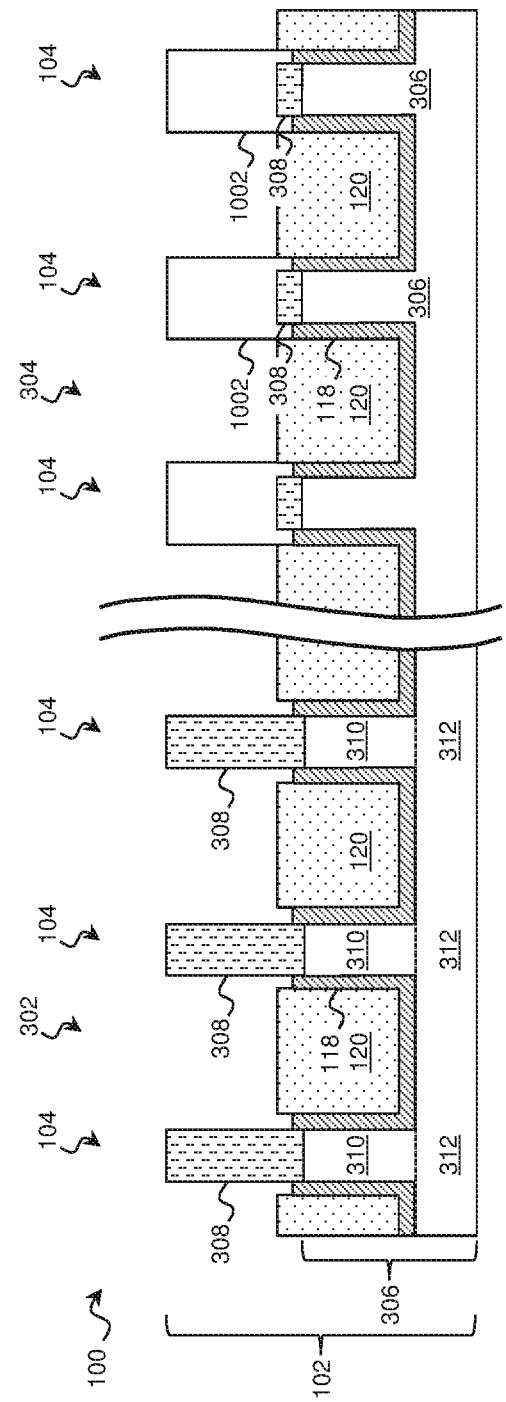
Figure 11A
Figure 11B

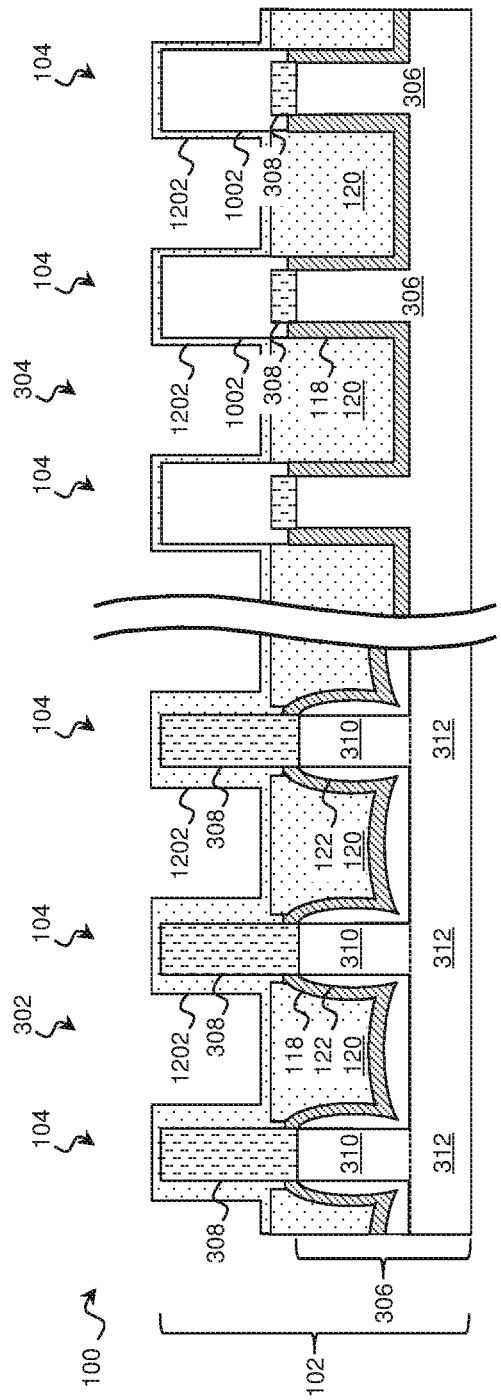
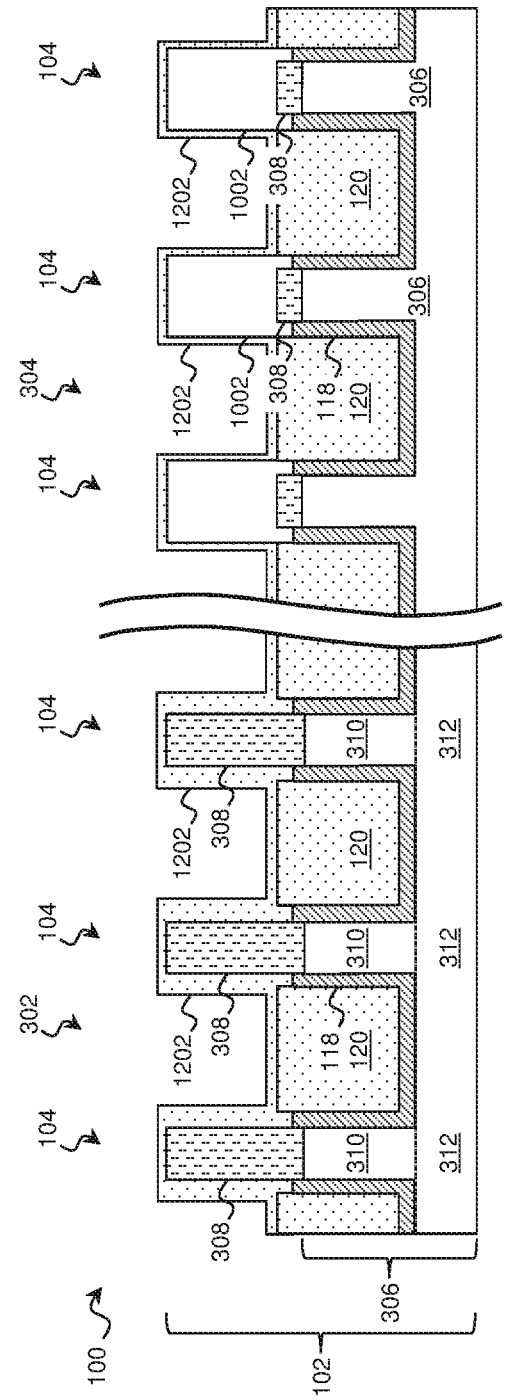

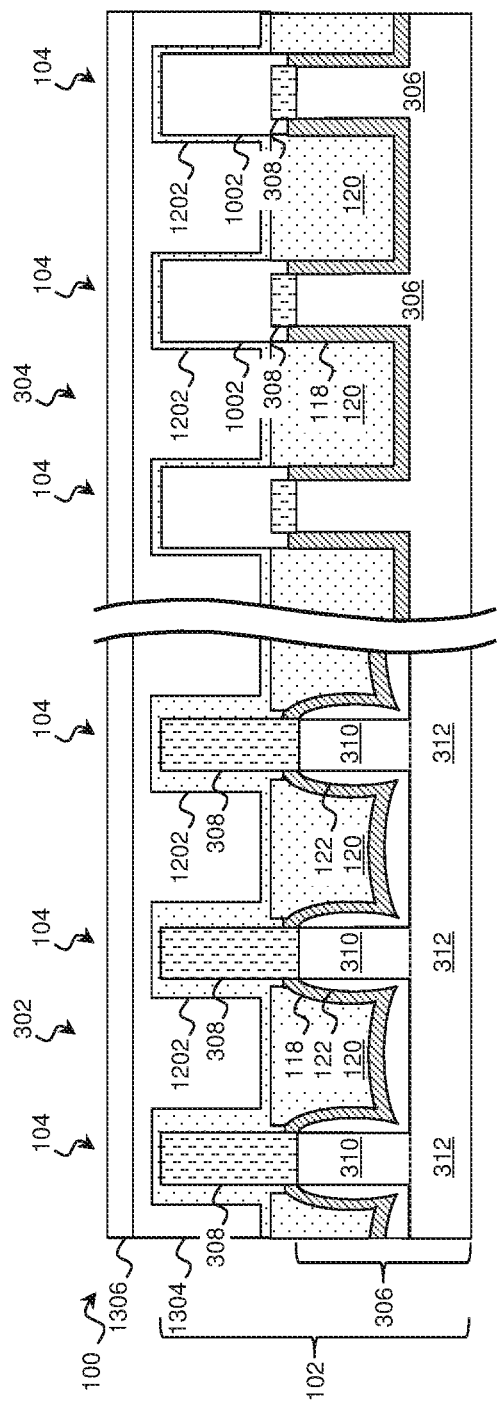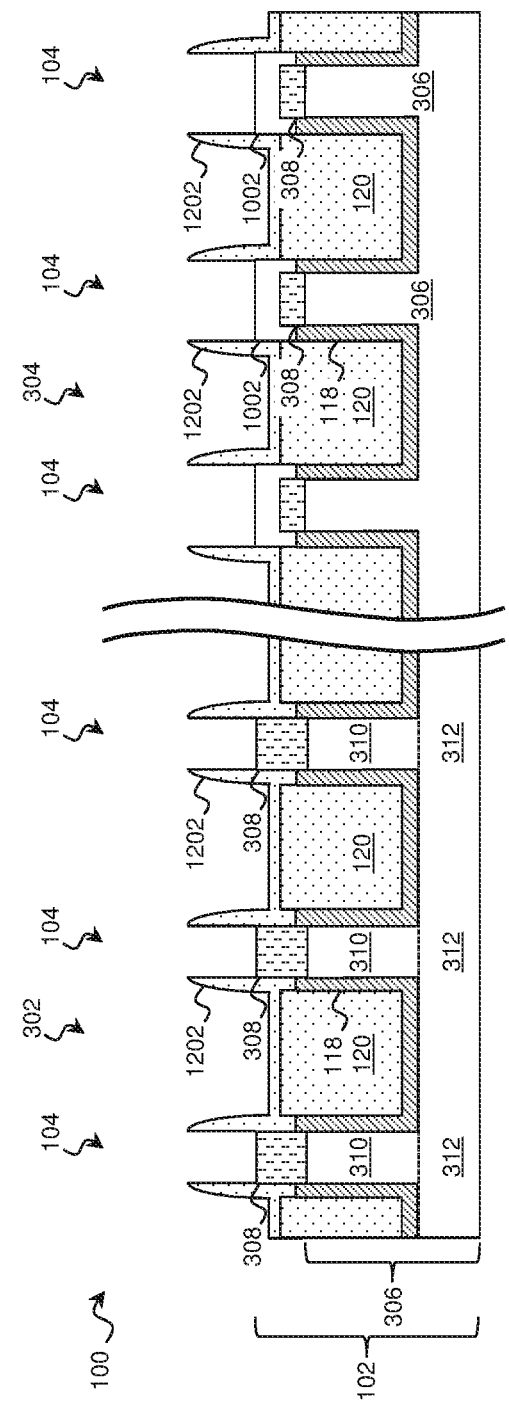

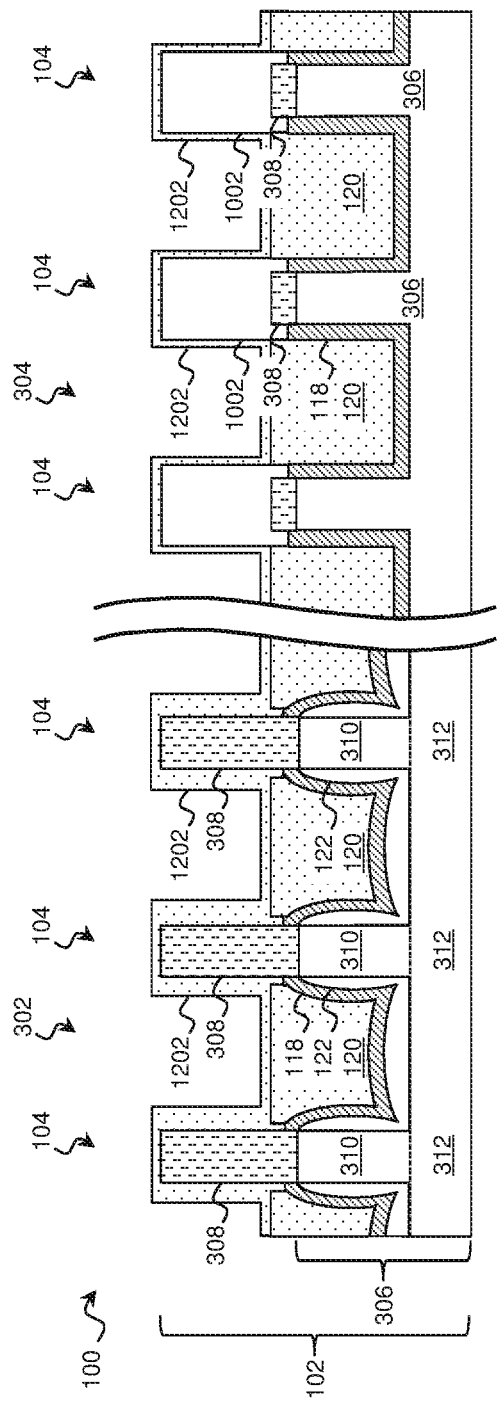
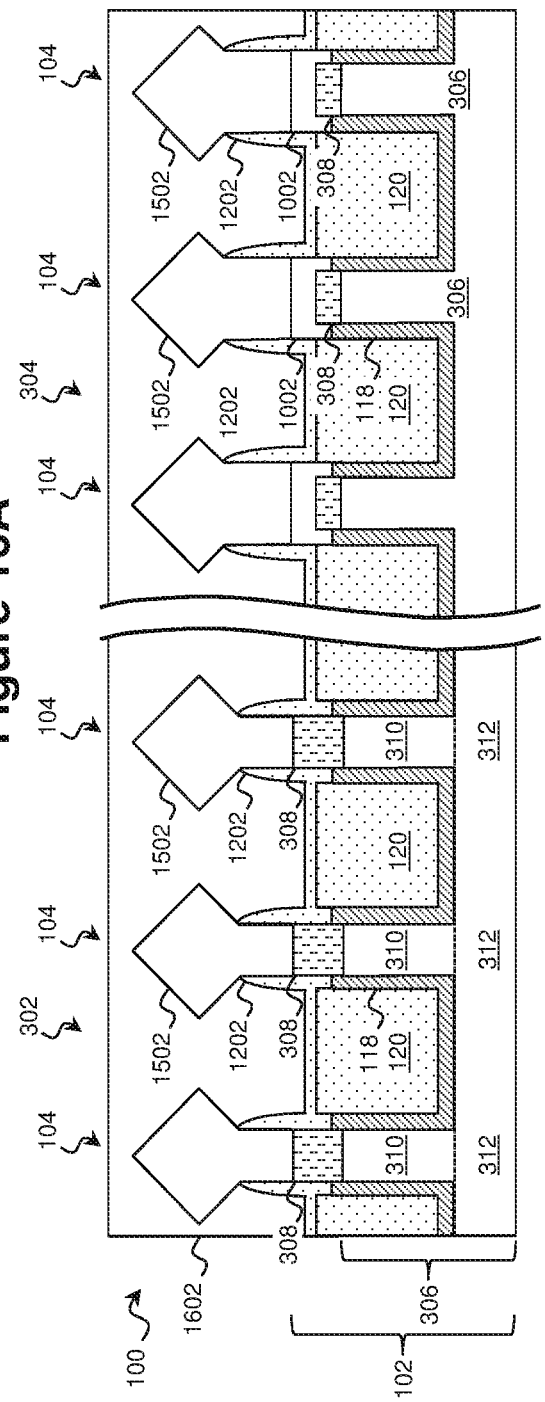
Figure 16A
Figure 16B

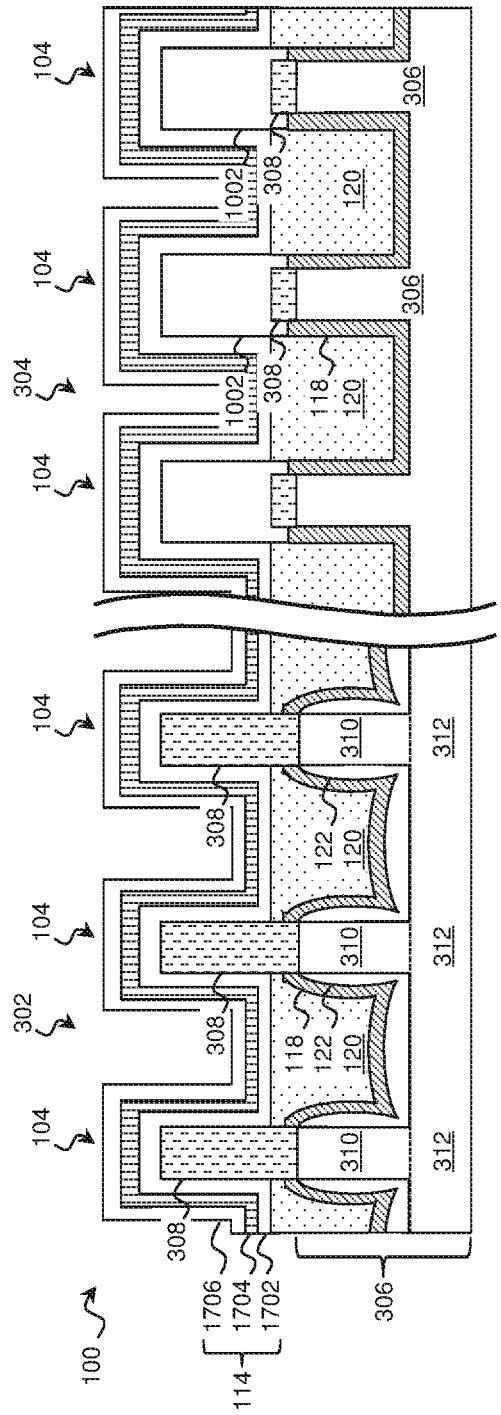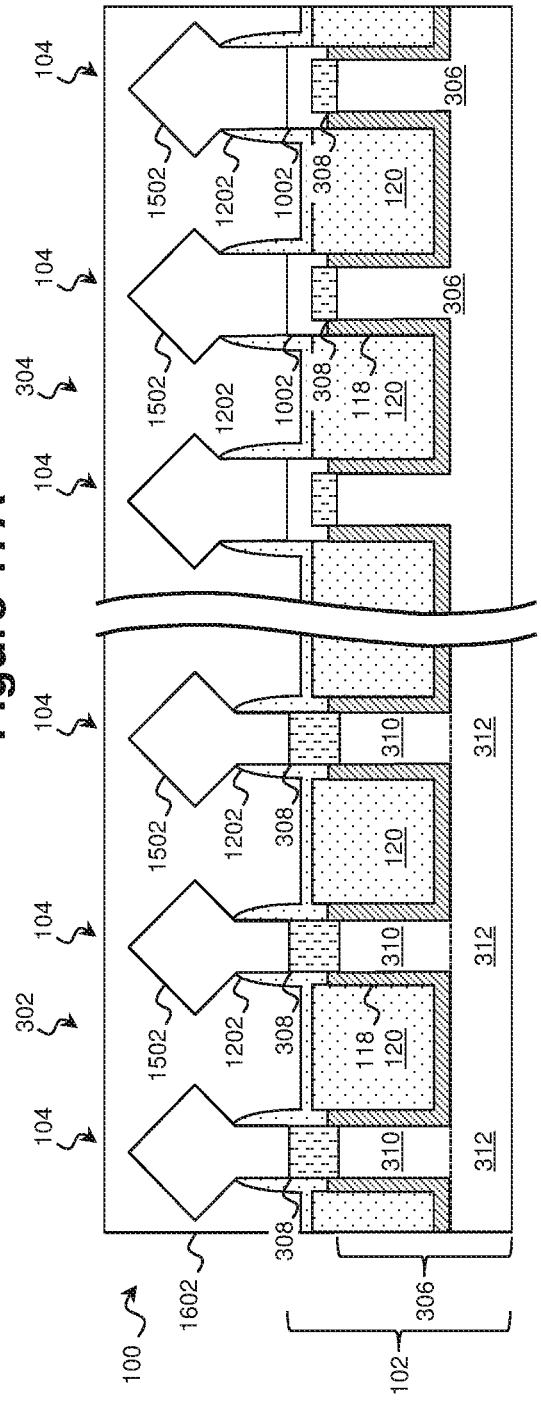
Figure 17A
Figure 17B

NONPLANAR DEVICE AND
STRAIN-GENERATING CHANNEL
DIELECTRIC

This application is a continuation application of U.S. patent application Ser. No. 15/805,892, filed Nov. 7, 2017, which is a continuation application of U.S. patent application Ser. No. 15/088,278, filed Apr. 1, 2016, now U.S. Pat. No. 9,837,321, which is a divisional application of U.S. patent application Ser. No. 14/451,503, filed Aug. 5, 2014, now U.S. Pat. No. 9,306,067, all of which are herein incorporated by reference in their entirety.

BACKGROUND

The semiconductor industry has progressed into nanometer technology process nodes in pursuit of higher device density, higher performance, and lower cost. Despite groundbreaking advances in materials and fabrication, scaling planar device such as the conventional MOSFET has proven challenging. To overcome these challenges, circuit designers are looking to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, FinFETs and other nonplanar devices are developing technologies, meaning that in many aspects, their full potential has not yet been realized. As merely one example, channel strain (internalized pressure within a channel region) has been used in planar devices to improve the flow of charge carriers through the channel region. However, in nonplanar devices, it has proven much more difficult to generate channel strain, and when channel strain is produced, it has proven difficult to obtain the expected improved carrier mobility. Accordingly, while conventional techniques for forming a strained channel within a nonplanar device have been adequate in some respects, they have been less than satisfactory in others. In order to continue to meet ever-increasing design requirements, further advances are needed in this area and others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3 and 4 are cross-sectional views of a portion of a workpiece undergoing a method for forming fin-based devices according to various aspects of the present disclosure.

FIGS. 5A, 6A, 7A, 8A, 9A, 10A, 11A, and 12A are cross-sectional views of a portion of a workpiece undergoing a method for forming fin-based devices showing a channel region of the workpiece according to various aspects of the present disclosure.

FIGS. 5B, 6B, 7B, 8B, 9B, 10B, 11B, and 12B are cross-sectional views of a portion of a workpiece undergoing a method for forming fin-based devices showing a source/drain region of the workpiece according to various aspects of the present disclosure.

FIGS. 14A, 15A, 16A, and 17A are cross-sectional views of a portion of a workpiece undergoing a method for forming fin-based devices showing a channel region of the workpiece according to various aspects of the present disclosure.

FIGS. 14B, 15B, 16B, and 17B are cross-sectional views of a portion of a workpiece undergoing a method for forming fin-based devices showing a source/drain region of the workpiece according to various aspects of the present disclosure.

DETAILED DESCRIPTION

Figure 1:
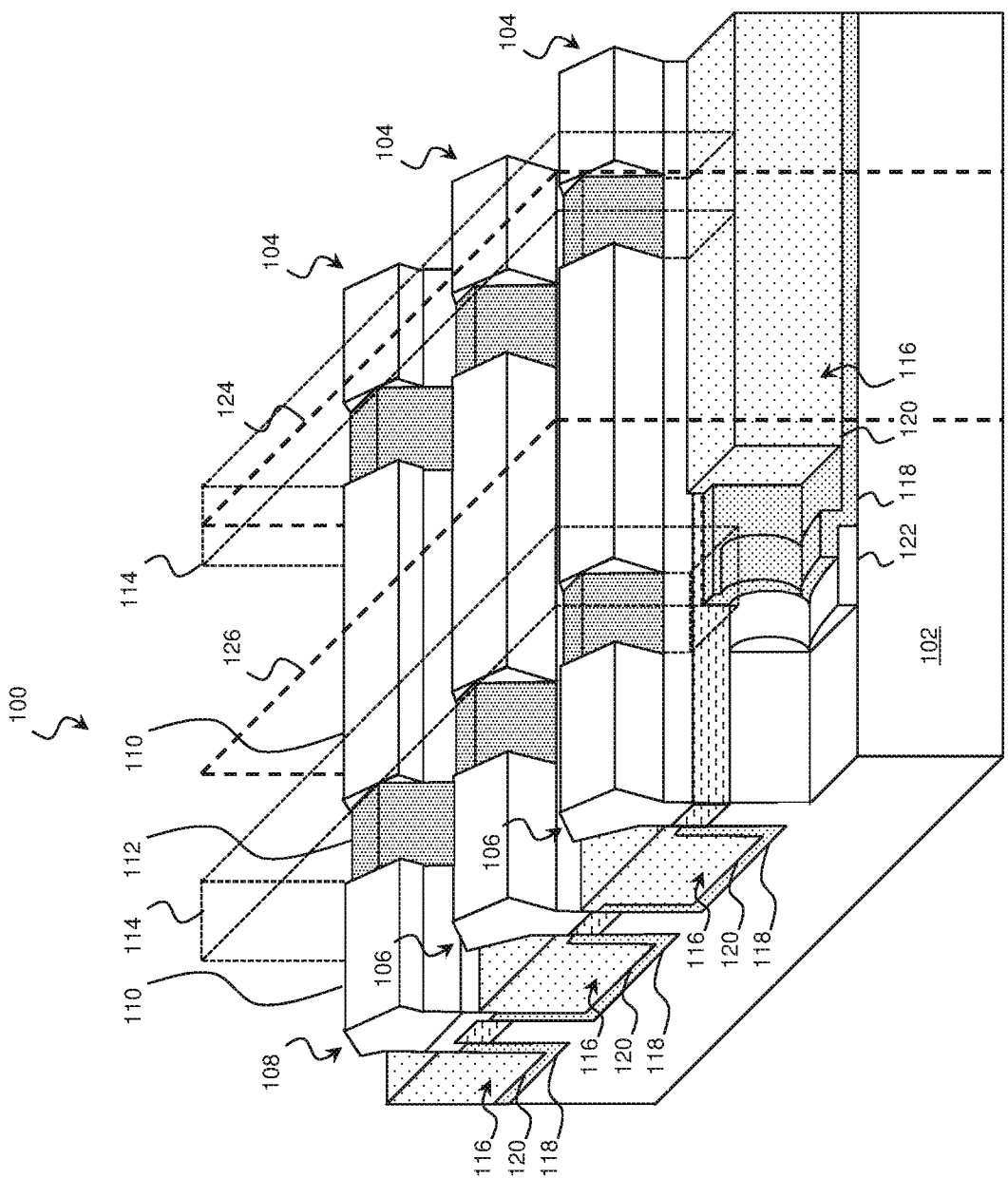
FIG. 1 is a perspective view of a portion of a workpiece according to various aspects of the present disclosure.

The present disclosure relates generally to IC device manufacturing and, more particularly, to a FinFET with a strain-producing feature disposed on the fin within an STI trench and extending down to the substrate.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer with one or more fin structures 104 formed upon it. The fin structures 104 are representative of any raised feature, and while the illustrated embodiments include FinFET fin structures 104, further embodiments include other raised active and passive devices formed upon the substrate 102. The illustrated fin structures 104 include an n-channel (NMOS) FinFET 106 and a p-channel (PMOS) FinFET 108. In turn, each of FinFETs 106 and 108 comprises a pair of opposing source/drain regions 110, which may include various doped semiconductor materials, and a channel region 112 disposed between the source/drain regions 110. The flow of carriers (electrons for the n-channel device and holes for the p-channel device) through the channel region 112 is controlled by a voltage applied to a gate stack 114 adjacent to and overwrapping the channel region 112. The gate stack 114 is shown as translucent to better illustrate the underlying channel region 112. In the illustrated embodiment, the channel region 112 rises above the plane of the substrate 102 upon which it is formed, and accordingly, the fin structure 104 may be referred to as a "nonplanar" device. The raised channel region 112 provides a larger surface area proximate to the gate stack 114 than comparable planar devices. This strengthens the electromagnetic field interactions between the gate stack 114 and the channel region 112, which may reduce leakage and short channel effects associated with smaller devices. Thus in many embodiments, FinFETs 106 and 108, and other nonplanar devices deliver better performance in a smaller footprint than their planar counterparts.

As described in more detail below, in order to electrically isolate the corresponding FinFETs 106 and 108 from each other, isolation features 116 are formed on the substrate 102 between the fin structures 104. An exemplary isolation feature 116 includes a liner 118 formed on the substrate 102 and a fill material 120 formed on the liner 118. The isolation features 116 may also include strain-producing structures 122 disposed within the trench between the fill material 120 and the substrate 102. In the illustration of FIG. 1, the fill material 120 is shown partially removed to reveal the underlying liner 118, and the underlying liner 118 is shown partially removed to reveal the strain-producing structure 122. As the name implies, the strain-producing structure 122 creates a strain on the surrounding portions of the fin structure 104 including the portion immediately above the structure 122. Properly configured, the increased strain improves the flow of carriers through these strained portions. In general, compressive strain on a channel region 112 improves the carrier mobility of PMOS devices, while tensile strain improves the carrier mobility of NMOS devices. Accordingly, in some embodiments, the strain-producing structure 122 is configured to provide tensile strain and is only formed underneath channel regions 112 of NMOS FinFETS 106.

Exemplary methods of forming FinFET devices 106 and 108 and strain-producing structures 122 will now be described with reference to FIGS. 2A-17B. The figures that follow refer to cross-sections taken through the channel region 112 (e.g., along plane 124) and/or through the source/drain regions 110 (e.g., along plane 126) of the FinFET devices 106 and 108. For reference, these cross-sectional planes 124 and 126 are shown in FIG. 1.

Figure 2A:
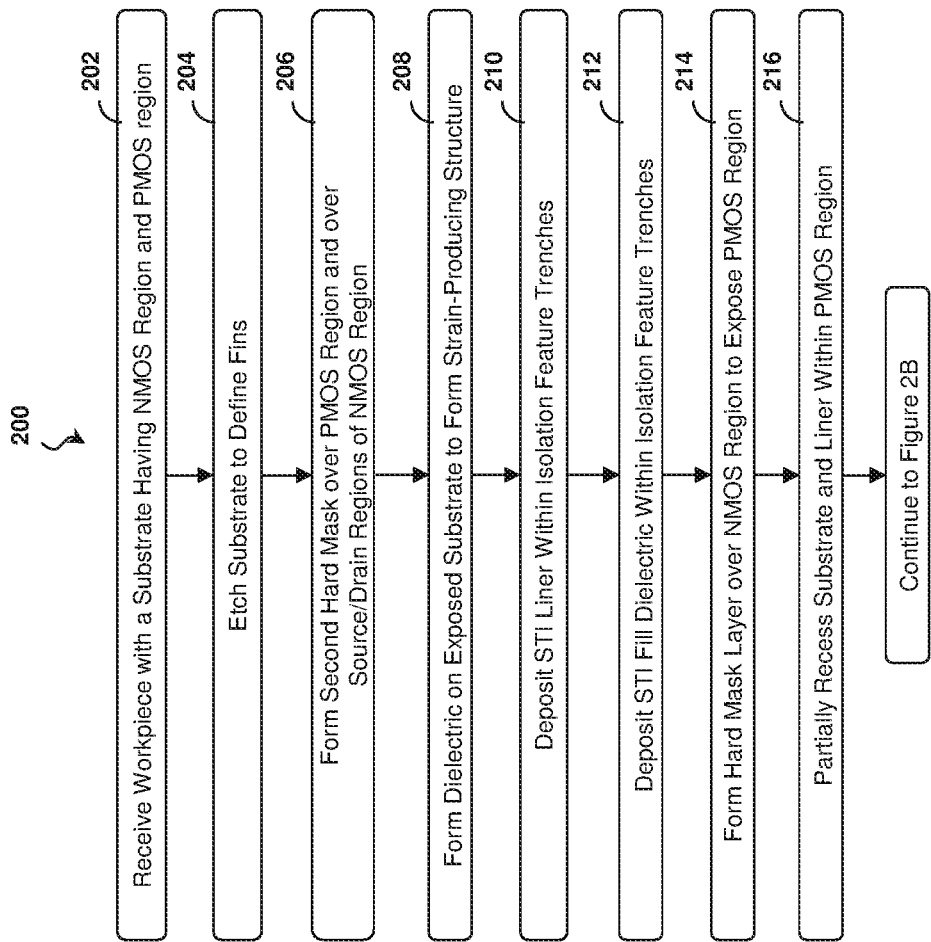
FIGS. 2A and 2B are flow diagrams of a method for fabricating fin-based devices on a workpiece according to various aspects of the present disclosure.
Figure 2B:
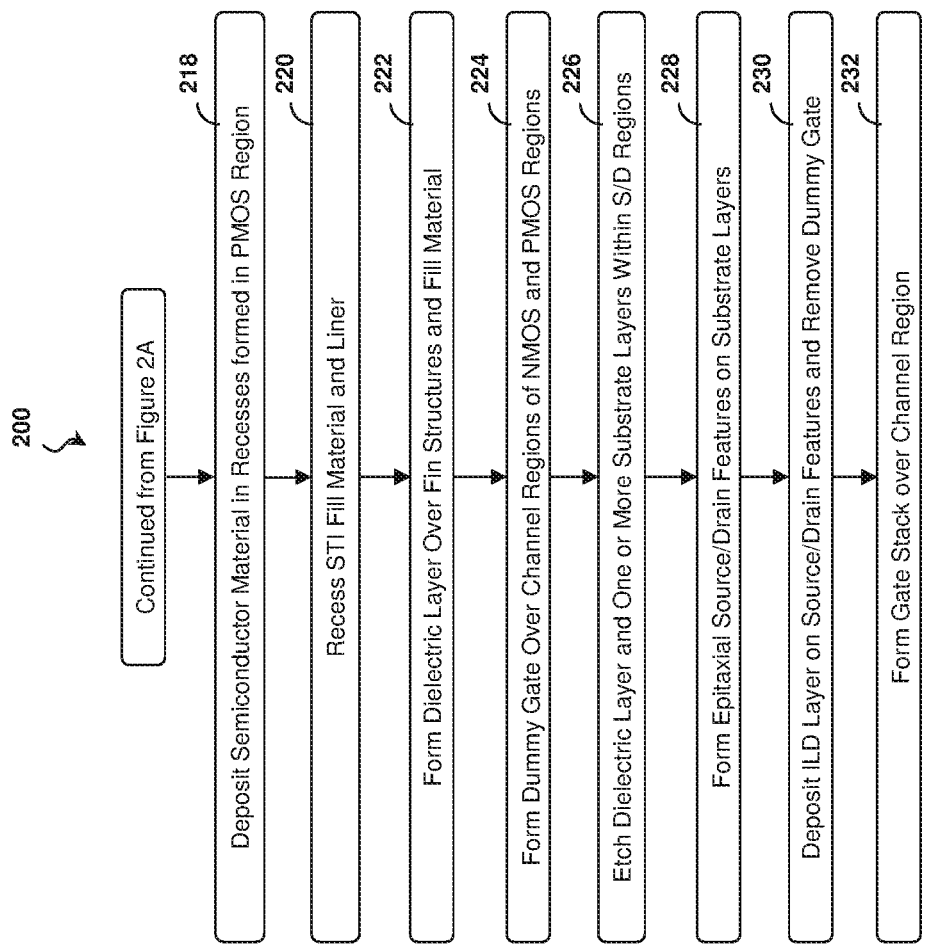
Figure 13:
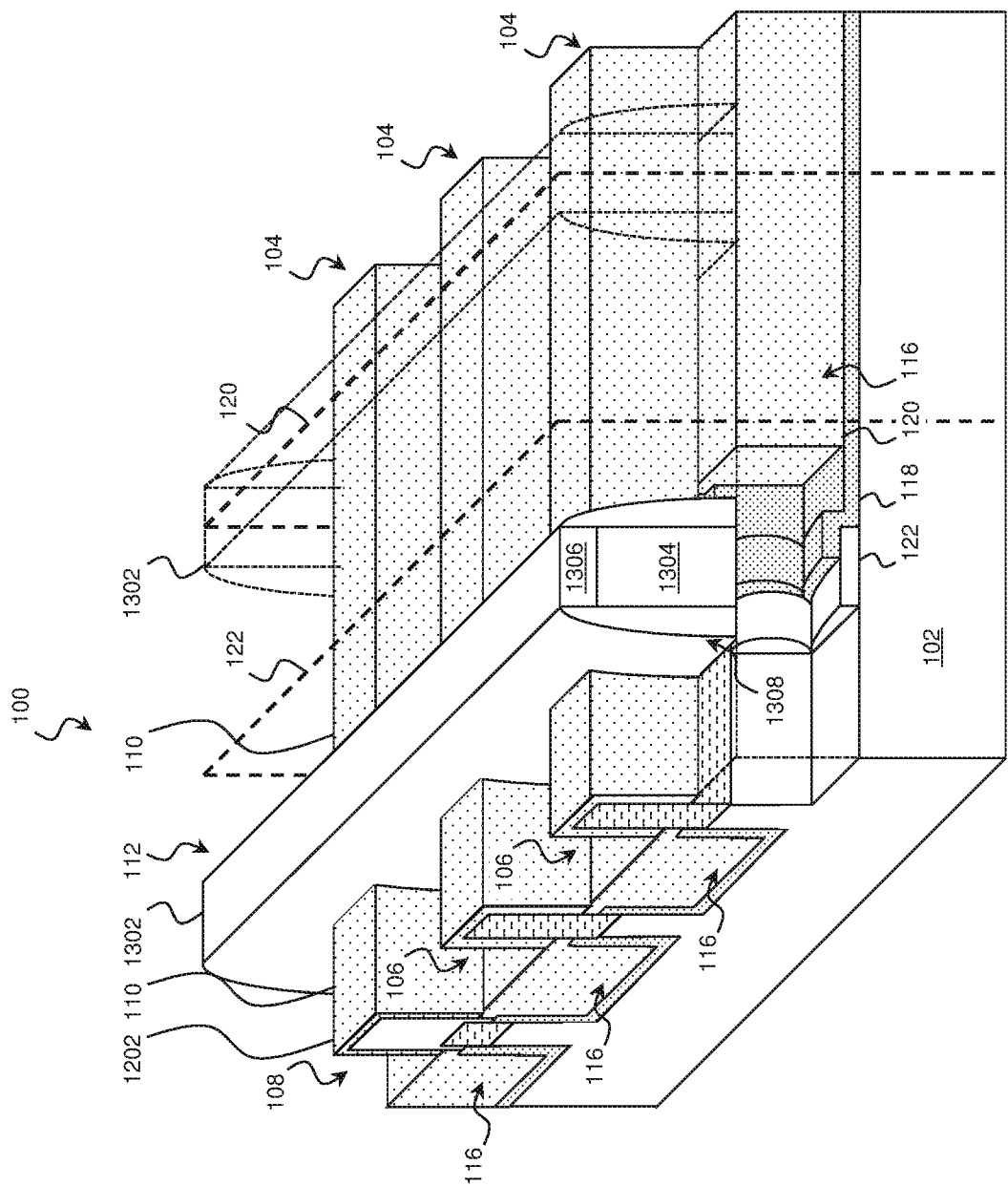
FIG. 13 is a perspective view of a portion of a workpiece undergoing a method for forming fin-based devices according to various aspects of the present disclosure.

FIGS. 2A and 2B are flow diagrams of a method 200 for fabricating fin-based devices on a workpiece 100 according to various aspects of the present disclosure. It is understood that additional steps can be provided before, during, and after the method 200 and that some of the steps described can be replaced or eliminated for other embodiments of the method. FIGS. 3 and 4 are cross-sectional views of a portion of the workpiece 100 undergoing the method 200, where the cross section is taken through the channel region 112 (along plane 124). Throughout the corresponding processes of blocks 202 and 204, the source/drain regions 110 and the channel regions 112 undergo substantially similar processes. To avoid unnecessary duplication, the substantially similar cross-sectional views showing a cross section taken along the source/drain regions 110 are omitted. However, for the latter processes, both channel region 112 and source/drain region 110 cross sections are provided. In that regard, FIGS. 5A, 6A, 7A, 8A, 9A, 10A, 11A, 12A, 14A, 15A, 16A, and 17A are cross-sectional views of a portion of the workpiece 100, where the cross-section is taken through the channel region 112 (along plane 124), according to various aspect of the present disclosure. FIGS. 5B, 6B, 7B, 8B, 9B, 10B, 11B, 12B, 14B, 15B, 16B, and 17B are cross-sectional views of a portion of the workpiece 100, where the cross section is taken through a source/drain region 110 (along plane 126), according to various aspects of the present disclosure. FIG. 13 is a perspective view of a portion of the workpiece 100 undergoing the method 200 according to various aspects of the present disclosure. FIGS. 3-17B have been simplified for the sake of clarity and to better illustrate the concepts of the present disclosure.

Referring first to block 202 of FIG. 2A and to FIG. 3, a workpiece 100 is received that includes a substrate 102. The substrate 102 may be divided into a first region for forming one or more NMOS FinFETs, referred to as an NMOS region 302, and a second region for forming one or more PMOS FinFETs, referred to as a PMOS region 304. The NMOS region 302 may be adjacent to or separate from the PMOS region 304, and a variety of isolation features including trench isolation features 116 and/or dummy devices may be formed between the regions. In the embodiments described in detail below, FinFETs are formed in the NMOS region 302 and PMOS region 304. However, it is understood that these FinFETs are representative of any raised structure, and further embodiments include other raised active and passive devices formed upon the substrate 102.

In some embodiments, the substrate 102 may include two or more layers, with substrate layers 306 and 308 shown. Suitable materials for either or both substrate layers 306 and 308 include bulk silicon. Alternatively, the substrate layers 306 and 308 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The substrate 102 may also include a silicon-on-insulator (SOI) structure. Accordingly, either or both of substrate layers 306 and 308 may include an insulator such as a semiconductor oxide, a semiconductor nitride, a semiconductor oxynitride, a semiconductor carbide, and/or other suitable insulator materials. SOI substrates are fabricated using separation by implantation of oxygen (SIMOX), wafer bonding, and/or other suitable methods. In an exemplary embodiment, a first substrate layer 306 includes SiGe, while a second substrate layer 308 includes elementary Si (i.e., doped or undoped Si without Ge or other semiconductors).

The substrate layers 306 and 308 may have non-uniform compositions. For example in FIG. 3, the first substrate layer 306 includes a top portion 310 that is different in composition from a bottom portion 312. In the example, the bottom portion 312 includes SiGe with a Ge concentration selected between about 10 atomic percent and about 30 atomic percent, while the top portion 310 includes SiGe with a Ge concentration greater than that of the bottom portion 312 and selected between about 15 atomic percent and about 60 atomic percent. The portions may have any relative thickness, and in the example, the top portion 310 has a thickness (indicated by arrow 314) of between about 30 nm and about 100 nm and the bottom portion 312 has a thickness (indicated by arrow 316) of between about 1 μm and about 3 μm. The composition of the substrate layers 306 and 308 may be used to tune the strain created by the interface between the layers 306 and 308 as well as to balance other characteristics of the associated device. For example, an SiGe semiconductor crystal has a larger intrinsic spacing than an elementary Si semiconductor crystal due to the presence of germanium atoms. The greater the concentration of Ge in the SiGe, the greater the corresponding spacing. Due in part to this different spacing, an interface between an Si crystalline structure and an SiGe crystalline structure (such as the interface between substrate layers 306 and 308) can be used produce an internal strain in the substrate 102 and in the surrounding structures.

As can be seen, the composition of the substrate layers 306 and 308 may also differ between the NMOS region 302 and the PMOS region 304. In the previous example, the first substrate layer 306 has the aforementioned different top portion 310 and bottom portion 312 in the NMOS region 302, while in the PMOS region, the first substrate layer 306 has a uniform composition that includes SiGe with a Ge concentration between about 10 atomic percent and about 30 atomic percent.

To facilitate fabrication and to avoid damage to the substrate layers, one or more hard mask layers 318 may be formed on the substrate 102. The hard mask layers 318 may include a dielectric such as a semiconductor oxide, a semiconductor nitride, a semiconductor oxynitride, and/or a semiconductor carbide, and in an exemplary embodiment, the hard mask layers 318 include a silicon oxide layer and a silicon nitride layer. The hard mask layers 318 may be formed by thermal growth, atomic-layer deposition (ALD), chemical vapor deposition (CVD), high-density plasma CVD (HDP-CVD), physical vapor deposition (PVD), and/or other suitable deposition processes.

A photoresist layer 320 may be formed on the hard mask layers 318 and used to define fin structures 104 in a subsequent step of the method 200. An exemplary photoresist layer 320 includes a photosensitive material that causes the layer to undergo a property change when exposed to light. This property change can be used to selectively remove exposed or unexposed portions of the photoresist layer in a process referred to as lithographic patterning.

Referring to block 204 of FIG. 2A and to FIG. 4, portions of the substrate 102 are etched to define the fin structures 104. In some embodiments, this includes a photolithographic technique that patterns the photoresist layer 320. For example, in one such embodiment, a photolithographic system exposes the photoresist layer 320 to radiation in a particular pattern determined by a mask. Light passing through or reflecting off the mask strikes the photoresist layer 320 thereby transferring a pattern formed on the mask to the photoresist 320. In other such embodiments, the photoresist layer 320 is patterned using a direct write or maskless lithographic technique such as laser patterning, e-beam patterning, and/or ion-beam patterning. Once exposed, the photoresist layer 320 is developed leaving only the exposed portions of the resist, or in alternate embodiments, leaving only the unexposed portions of the resist. An exemplary patterning process includes soft baking of the photoresist layer 320, mask aligning, exposure, post-exposure baking, developing the photoresist layer 320, rinsing, and drying (e.g., hard baking).

In the embodiment of FIG. 4, the patterning process leaves only those portions of the photoresist layer 320 that are directly above fin structure 104 regions. The remaining portions of the photoresist layer 320 are removed to reveal portions of the substrate 102 intended to be etched. Accordingly, after patterning the photoresist 320, one or more etching processes may be performed on the workpiece 100 to open the hard mask layers 318 and to etch the portions of the substrate 102 and/or substrate layers 306 and 308 not covered by the photoresist layer 320. The etching processes may include any suitable etching technique such as dry etching, wet etching, and/or other etching methods (e.g., reactive ion etching (RIE)). In some embodiments, etching includes multiple etching steps with different etching chemistries, each targeting a particular material of the workpiece 100. For example, in an embodiment, the substrate 102 is etched by a dry etching process using a fluorine-based etchant.

The etching is configured to produce fin structures 104 of any suitable height and width extending above the reminder of the substrate 102. In the illustrated embodiment, the process etches completely through the second substrate layer 308 and through the top portion 310 of the first substrate layer 306 (in the NMOS region 302) but does not etch through the bottom portion 312 of the first substrate layer in the NMOS region 302. Of course, these depths are merely exemplary. In addition to defining the fin structures 104, the etching of block 204 may also define one or more isolation feature trenches 402 between the fin structures 104. The trenches 402 may be subsequently filled with a dielectric material to form an isolation feature 116, such as a shallow trench isolation feature (STI). After etching, the remaining photoresist layer 320 and hard mask layers 318 may be removed.

Referring to block 206 of FIG. 2A and to FIGS. 5A and 5B, a second hard mask 502 is formed over the fin structure 104. The second hard mask 502 covers the PMOS region 304 and the source/drain regions 110 of the NMOS region 302, but exposes the channel region 112 of the NMOS region 302. This allows the subsequent strain-producing structure 122 to be formed underneath the channel region 112 of the NMOS devices without being formed elsewhere. The second hard mask 502 may include any suitable dielectric material, and an exemplary second hard mask 502 includes a semiconductor nitride. In order to expose only the NMOS channel region 112, the second hard mask 502 may be formed across the fin structures 104 of both the NMOS region 302 and the PMOS region 304, and then selectively etched or otherwise removed from the NMOS channel region 112. In one such embodiment, a photoresist layer is deposited on the second hard mask 502 after the second hard mask 502 has been deposited over both regions 302 and 304. The photoresist layer is lithographically patterned to expose the portion of the second hard mask 502 disposed within the NMOS channel region 112 for etching. Then, the second hard mask 502 is removed from the NMOS channel region 112, and the remaining photoresist may be stripped.

Referring to block 208 of FIG. 2A and to FIGS. 6A and 6B, a dielectric material is formed on a portion of the substrate 102 exposed by the second hard mask 502 to produce a strain-producing structure 122. The dielectric material may include any suitable dielectric, and in some exemplary embodiments includes a semiconductor oxide. Accordingly, in one such embodiment, the exposed portion of the first substrate layer 306 within the channel region 112 of the NMOS region 302 is oxidized to form a strain-producing structure 122. Oxidation and other dielectric-forming techniques may alter the lattice structure and/or spacing of the substrate 102 and can be used to create or relieve strain on the fin structures 104. In particular, for an SiGe-containing first substrate layer 306 and an elementary Si-containing second substrate layer 308, selective oxidation of the first layer 306 imparts a tensile strain on adjacent areas of the fin structure 104. This may render the fin 104 more suitable for an NMOS FinFET. For this reason and others, the dielectric-forming process may be limited to the channel region 112 of the NMOS region 302 by the second hard mask 502. In such embodiments, the strain-producing structure 122 is formed on vertical surfaces of the first substrate layer 306 and may also be formed on horizontal surfaces of the first substrate layer 306 between the fin structures 104.

Any suitable oxidation process may be used to oxidize the substrate 102, and in an exemplary embodiment, a wet oxidation process is used because it tends to selectively oxidize Ge within the first substrate layer 306 without oxidizing Si within the second substrate layer 308. For example, the workpiece 100 may be heated to and maintained at between about 400° C. and about 500° C. while pure water (vapor) is supplied to the substrate 102 in an environment maintained at about 1 Atm of pressure for between about thirty minutes and about one hour. The oxidation technique forms a SiGe oxide strain-producing structure 122 within the isolation feature trench in the channel region 112 of the NMOS region 302. Elsewhere, the second hard mask 502 prevents oxidation of the first substrate layer 306, such that the strain-producing structure is not formed in the source/drain regions 110 of the NMOS region 302 or anywhere within the PMOS region 304. The strain-producing structure 122 may be formed to any suitable thickness, and in various exemplary embodiments, has a thickness at its thickest point of between about 3 nm and about 10 nm as measured perpendicular to a horizontal or vertical surface of the substrate 102. After the formation of the strain-producing structure 122, the second hard mask 502 may be removed.

Referring to block 210 of FIG. 2A and to FIGS. 7A and 7B, a liner 118 may be formed on the substrate 102 including on both the fin structures 104 and the strain-producing structures 122. The liner 118 reduces crystalline defects at the interface between the substrate 102 and the dielectric fill material and may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, ALD, CVD, HDP-CVD, PVD, and/or other suitable deposition processes. In some embodiments, the liner 118 includes a conventional thermal oxide liner formed by a thermal oxidation process. In some exemplary embodiments, the liner 118 includes a semiconductor nitride formed via HDP-CVD.

Referring to block 212 of FIG. 2A and to FIGS. 8A and 8B, an STI fill material 120 or fill dielectric is then deposited within the isolation feature trenches 402 to further define the isolation features 116. Suitable fill materials 120 include semiconductor oxides, semiconductor nitrides, semiconductor oxynitrides, FSG, low-K dielectric materials, and/or combinations thereof. In various exemplary embodiments, the fill material 120 is deposited using a HDP-CVD process, a sub-atmospheric CVD (SACVD) process, a high-aspect ratio process (HARP), and/or a spin-on process. In one such embodiment, a CVD process is used to deposit a flowable dielectric material that includes both a dielectric fill material 120 and a solvent in a liquid or semiliquid state. A curing process is used to drive off the solvent, leaving behind the dielectric fill material 120 in its solid state.

The deposition of the fill material 120 may be followed by a chemical mechanical polishing/planarization (CMP) process. In the illustrated embodiment, the CMP process completely removes the topmost portion of the liner 118 from the fin structure 104, although in further embodiments, some portion of the liner 118 remains on top of the fin structure 104 after the CMP process.

Referring to block 214 of FIG. 2A and to FIGS. 9A and 9B, a third hard mask layer 902 is formed over the NMOS region 302 to allow the PMOS region 304 to be selectively processed. Exemplary third hard mask layer 902 materials include a dielectric such as a semiconductor oxide, a semiconductor nitride, a semiconductor oxynitride, and/or a semiconductor carbide, and in an exemplary embodiment, the third hard mask layer 902 include a silicon oxide layer and a silicon nitride layer. The third hard mask layer 902 may be formed by thermal growth, ALD, chemical vapor deposition (CVD), high-density plasma CVD (HDP-CVD), physical vapor deposition (PVD), and/or other suitable deposition processes. In some embodiments, the third hard mask layer 902 is deposited over both the NMOS region 302 and the PMOS region 304 and then selectively removed from the PMOS region 304.

Referring to block 216 of FIG. 2A and referring still to FIGS. 9A and 9B, the substrate 102 is partially recessed in the PMOS region 304, while the third hard mask layer 902 protects the substrate 102 within the NMOS region 302. Any suitable etching technique may be used to recess the second substrate layer 308 in the PMOS region 304 including dry etching, wet etching, RIE, and/or other etching methods, and in an exemplary embodiment, a dry etching technique utilizing fluorine-containing gas (e.g., $CF_2$) selectively etches the second substrate layer 308 without etching the surrounding structures. Some amount of the second substrate layer 308 may remain after the etching, and in various examples, the remaining second substrate layer 308 has a thickness of between about 5 nm and about 25 nm.

Recessing the substrate 102 in block 216 may also include recessing a portion of the liner 118 in the PMOS region 304. By recessing the liner 118, the surface area of the second substrate layer 308 available for epitaxial growth is increased, thereby providing a better bond between the second substrate layer 308 and any subsequently formed layers. Any suitable etching technique may be used to recess the liner 118 including dry etching, wet etching, RIE, and/or other etching methods, and in an exemplary embodiment, a wet etching technique utilizing HF selectively etches the liner 118 without etching the surrounding structures. The liner 118 may be recessed further than the second substrate layer 308, and in the illustrated embodiment, the top surface of the liner 118 is below the top surface of the second substrate layer 308 after etching.

Figure 10A:
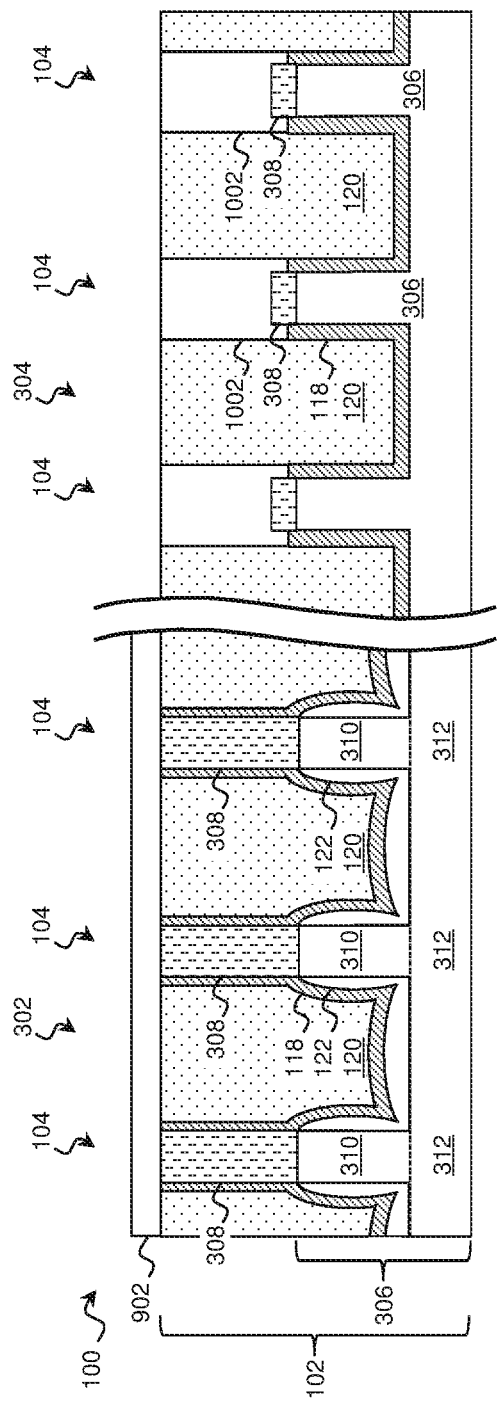
Figure 10B:
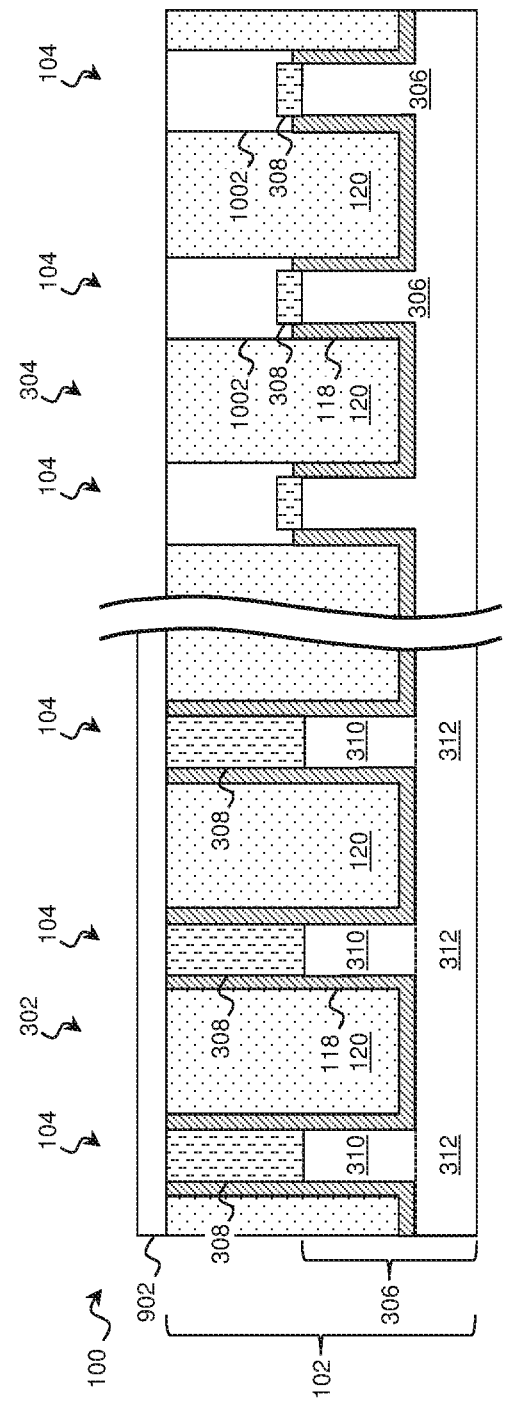

Referring to block 218 of FIG. 2B and referring to FIGS. 10A and 10B, a third substrate layer 1002 is formed on the second substrate layer 308 in the PMOS region 304. As with the first and second substrate layers, the third substrate layer 1002 may comprise an elementary (single element) semiconductor, a compound semiconductor, a dielectric, or combinations thereof. In various exemplary embodiments, the third substrate layer 1002 includes SiGe with a Ge concentration between about 45 atomic percent and about 100 atomic percent. In a further exemplary embodiment, the third substrate layer 1002 includes doped or undoped Ge without Si (i.e., an elementary Ge semiconductor). The third substrate layer 1002 may be deposited by any suitable technique including epitaxial growth, ALD, CVD, and/or PVD, and may be formed to any suitable thickness. In some exemplary embodiments, the third substrate layer 1002 is formed to a thickness of between about 20 nm and about 40 nm.

In embodiments in which the liner 118 is recessed further than the second substrate layer 308, the third substrate layer 1002 may be deposited on three or more surfaces of the second substrate layer 308 (a horizontal top surface and two vertical side surfaces). This increased bonding area may reduce the occurrence of voids and other interface defects at the interface between the second substrate layer 308 and the third substrate layer 1002. The deposition of the third substrate layer 1002 may be followed by a CMP process to remove material extending above the fill dielectric. The third hard mask layer 902 may be removed from the NMOS region 302 after the third substrate layer 1002 is deposited, and this may be performed as part of the CMP process or by another suitable technique.

Referring to block 220 of FIG. 2B and referring to FIGS. 11A and 11B, the fill material 120 is recessed. Within the NMOS region, the recessing process may include recessing a portion of the liner 118 as well. In the illustrated embodiment, the liner 118 in the NMOS region 302 is recessed further than the fill material 120 such that the top surface of the liner 118 in the NMOS region 302 is below the top surface of the fill material 120 in the region. The gap between the top surface of the fill material 120 and the top surface of the liner 118 can be controlled by tuning the etching technique, and in various embodiments, ranges between about 3 nm and about 10 nm. Any suitable etching technique may be used to recess the fill material 120 and/or the liner 118 including dry etching, wet etching, RIE, and/or other etching methods, and in an exemplary embodiment, an anisotropic dry etching is used to selectively remove the fill material 120 without etching the substrate layers.

Referring to block 222 of FIG. 2B and to FIGS. 12A and 12B, a dielectric layer 1202 is formed over the fin structures 104 and the fill material 120. The dielectric layer 1202 may serve a number of purposes including filling in the gap left by recessing the liner 118 in the NMOS region. The dielectric layer 1202 may also be used as part of a dummy gate structure. In that regard, in order to protect the channel region 112 of the fin structures 104 during the formation of source/drain features 1502, a dummy gate may be formed over the channel regions 112 of the NMOS region 302 and/or the PMOS region 304. Accordingly in an embodiment, the portion of the dielectric layer 1202 disposed in the channel region 112 is a dummy-gate dielectric. The dielectric layer 1202 may include any suitable dielectric material, such as a semiconductor oxide, a semiconductor nitride, a semiconductor carbide, a semiconductor oxynitride, other suitable materials, and/or combinations thereof, and in an exemplary embodiment, includes the same dielectric material and composition as the fill material 120.

Referring to block 224 of FIG. 2B and to FIG. 13, remaining structures of the dummy gate 1302 such as a dummy gate layer 1304, a dummy gate hard mask layer 1306, and/or gate spacers 1308 are formed on the dielectric layer 1202. In more detail, forming the dummy gate 1302 may include depositing the dummy gate layer 1304 containing polysilicon or other suitable material and patterning the layer in a lithographic process. Thereafter, the dummy gate hard mask layer 1306 may be formed on the dummy gate layer 1304 and may include any suitable material, such as a semiconductor oxide, a semiconductor nitride, a semiconductor carbide, a semiconductor oxynitride, other suitable materials, and/or combinations thereof.

In some embodiments, the gate spacers 1308 or sidewall spacers are formed on each side of the dummy gate 1302 (on the sidewalls of the dummy gate 1302). The gate spacers 1308 may be used to offset the subsequently formed source/drain features 1502 and may be used for designing or modifying the source/drain structure (junction) profile. The gate spacers 1308 may include any suitable dielectric material, such as a semiconductor oxide, a semiconductor nitride, a semiconductor carbide, a semiconductor oxynitride, other suitable materials, and/or combinations thereof.

Referring to block 226 of FIG. 2B and to FIGS. 14A and 14B, the dielectric layer 1202 and one or more of the substrate layers within the source/drain regions 110 are etched. With respect to the dielectric layer 1202, the etching technique may leave a portion of the layer 1202 extending above the top surface of the substrate layers in order to control and align the epitaxial growth of the source/drain features 1502. This can be achieved through the use of an anisotropic etching technique configured to etch horizontal surfaces of the dielectric layer 1202 faster than vertical surfaces. With respect to the substrate layers, in the NMOS region 302, the etching leaves a portion of the second substrate layer 308 remaining to act as a seed layer for the epitaxial growth process. In the PMOS region 304, the etching may leave a portion of the third substrate layer 1002 remaining to act as a seed layer for the epitaxial growth process. In another embodiment, the etching may completely remove the third substrate layer 1002 from the source/drain regions 110 of the PMOS region 304 yet leave a portion of the second substrate layer 308 to act as a seed layer. The etching may be performed as a single etching process or as multiple etching processes using a variety of etchants and techniques, and in various embodiments, the etching process includes dry etching (such as the aforementioned anisotropic dry etching technique), wet etching, RIE and/or other suitable etching techniques.

Figure 15A:
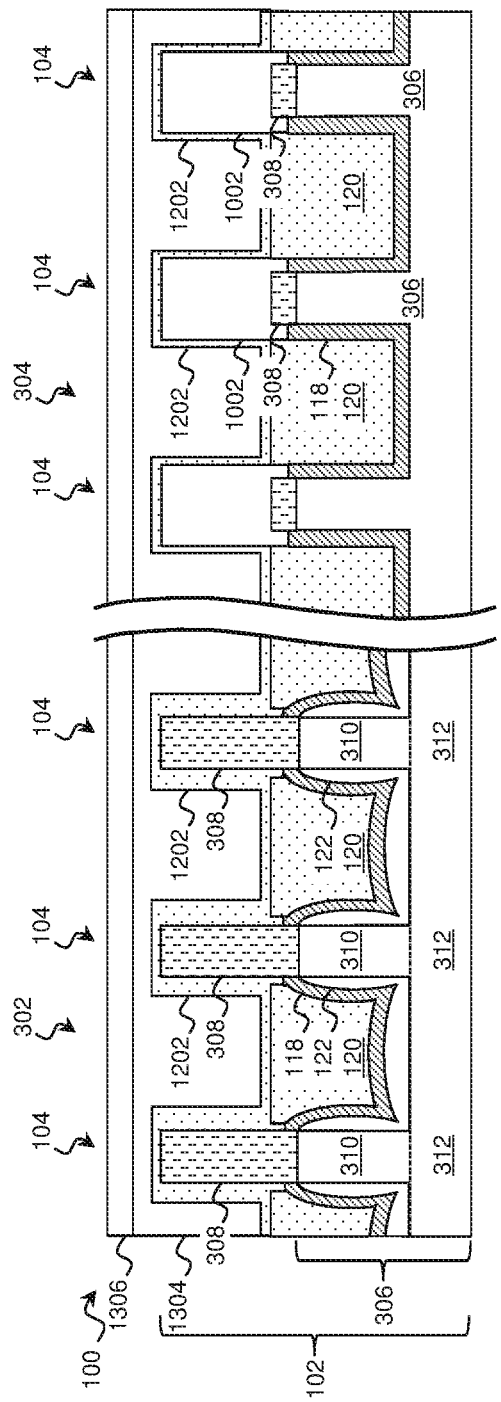
Figure 15B:
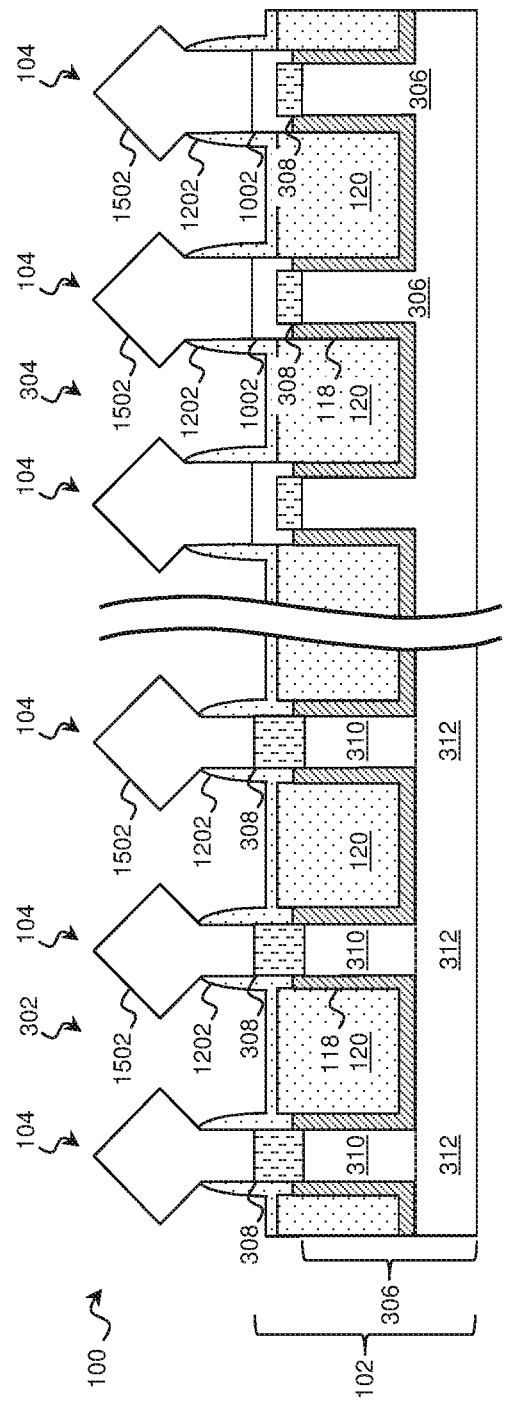

Referring to block 228 of FIG. 2B and to FIGS. 15A and 15B, raised source/drain features 1502 are formed on the substrate layers (e.g., the second substrate layer 308 in the NMOS region 302, the third substrate layer 1002 in the PMOS region 304, etc.). The dummy gate 1302 and/or gate spacers 1308 limit the source/drain features 1502 to the source/drain regions 110, and the dielectric layer 1202 limits the source/drain features horizontally within the source/drain regions 110. In many embodiments, the source/drain features 1502 are formed by one or more epitaxy or epitaxial (epi) processes, whereby Si features, SiGe features, and/or other suitable features are grown in a crystalline state on the fin structure 104. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 104.

The source/drain features 1502 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 1502 are not in-situ doped, an implantation process (i.e., a junction implant process) is performed to dope the source/drain features 1502. In an exemplary embodiment, the source/drain features 1502 in the NMOS region 302 include SiP, while those in the PMOS region 304 include GeSnB (tin may be used to tune the lattice constant) and/or SiGeSnB. One or more annealing processes may be performed to activate the source/drain features 1502. Suitable annealing processes include rapid thermal annealing (RTA) and/or laser annealing processes.

Referring to block 230 of FIG. 2B and to FIGS. 16A and 16B, an inter-level dielectric (ILD) 1602 is formed on the source/drain features 1502 in the source/drain regions 110. The ILD 1602 may surround the dummy gate 1302 and/or gate spacers 1308 allowing these features to be removed and a replacement gate 114 to be formed in the resulting cavity. Accordingly, in such embodiments, the dummy gate 1302 is removed after depositing the ILD 1602 as shown in FIG. 16A. The ILD 1602 may also be part of an electrical interconnect structure that electrically interconnects the devices of the workpiece including the FinFET devices 106 and 108. In such embodiments, the ILD 1602 acts as an insulator that supports and isolates the conductive traces. The ILD 1602 may comprise any suitable dielectric material, such as a semiconductor oxide, a semiconductor nitride, a semiconductor oxynitride, a semiconductor carbide, other suitable materials, and/or combinations thereof.

Referring to block 232 of FIG. 2B and to FIGS. 17A and 17B, a gate stack 114 is formed on the workpiece 100 wrapping around the channel regions 112 of the fin structures 104. Although it is understood that the gate stack 114 may be any suitable gate structure, in some embodiments, gate stack 114 is a high-k metal gate that includes an interfacial layer 1702, a gate dielectric layer 1704, and a metal gate layer 1706 that may each comprise a number of sub-layers.

In one such embodiment, the interfacial layer 1702 is deposited by a suitable method, such as ALD, CVD, ozone oxidation, etc. The interfacial layer 1702 may include an oxide, HfSiO, a nitride, an oxynitride, and/or other suitable material. Next, a high-k gate dielectric layer 1704 is deposited on the interfacial layer 1702 by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

A metal gate layer 1706 is then formed by ALD, PVD, CVD, or other suitable process, and may include a single layer or multiple layers, such as a metal layer, a liner layer, a wetting layer, and/or an adhesion layer. The metal gate layer 1706 may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate stack 114. After the gate stack 114 is formed, the workpiece 100 may be provided for further fabrication, such as contact formation and further fabrication of the interconnect structure.

Thus, the present disclosure provides a technique for enhancing the channel strain of nonplanar semiconductor devices by forming a strain-producing structure underlying the channel region. In some embodiments, an integrated circuit device is provided. The integrated circuit includes a substrate and a first fin structure and a second fin structure each disposed on the substrate. The substrate has an isolation feature trench defined between the first fin structure and the second fin structure. The integrated circuit device also includes a strain feature disposed on a horizontal surface of the substrate within the isolation feature trench, and a fill dielectric disposed on the strain feature within the isolation feature trench. In some such embodiments, the strain feature is further disposed on a vertical surface of the first fin structure and on a vertical surface of the second fin structure. In some such embodiments, the strain feature is configured to produce a strain on a channel region of a transistor formed on the first fin structure. In some such embodiments, the integrated circuit device also includes a third fin structure disposed on the substrate that has a p-channel device disposed thereupon. The third fin structure has a first layer disposed on the substrate, a second layer disposed on the first layer, and a third layer disposed on at least three surfaces of the second layer.

In further embodiments, a semiconductor device is provided that includes a substrate, and a fin extending vertically from the substrate. The fin includes two or more source/drain regions and a channel region disposed between the two or more source/drain regions. The semiconductor device also includes an isolation feature disposed on the substrate adjacent to the fin that comprises a liner a liner disposed on a side surface of the fin and on a top surface of the substrate and a fill material disposed on the liner. The fill material has a topmost surface opposite the substrate, such that the liner is disposed away from the topmost surface of the fill material. In some such embodiments, the semiconductor device further includes a strain feature disposed on the side surface of the fin between a semiconductor material of the fin and the liner. In some such embodiments, the fin includes a first semiconductor layer disposed on the substrate, a second semiconductor layer disposed on the first semiconductor layer, and a third semiconductor layer disposed on at least three surfaces of the second semiconductor layer. The second semiconductor layer has a different composition than the first semiconductor layer and the third semiconductor layer.

In yet further embodiments, a method of forming a semiconductor device is provided. The method includes receiving a workpiece having a fin structure formed thereupon, wherein the fin structure includes a first semiconductor portion and a second semiconductor portion that is different in composition from the first semiconductor portion. A strain structure is selectively formed on the first semiconductor portion within a channel region of the fin structure. An isolation feature is formed on the strain structure. The second semiconductor portion is recessed in a pair of source/drain regions adjacent to the channel region. Source/drain structures are epitaxially grown on the recessed second semiconductor portion in the pair of source/drain regions. In some such embodiments, the selectively forming of the strain structure further includes oxidizing the first semiconductor portion within the channel region of the fin structure to form the strain structure to include a semiconductor oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a fin structure having a first portion disposed between second portions, wherein the first portion and the second portions include a first semiconductor material disposed over a second semiconductor material, wherein the second semiconductor material is different than the first semiconductor material;
   an isolation feature disposed over sidewalls of the second semiconductor material of the first portion of the fin structure and sidewalls of the second semiconductor material of the second portions of the fin structure;
   a gate structure disposed over sidewalls and a top surface of the first semiconductor material of the first portion of the fin structure;
   epitaxial features disposed over a top surface of the first semiconductor material of the second portions of the fin structure; and
   a strain-producing layer disposed between the isolation feature and the sidewalls of the second semiconductor material of the first portion of the fin structure, wherein the strain-producing layer includes a semiconductor oxide material.

2. The transistor of claim 1, wherein:
   the fin structure is disposed on a substrate;
   the strain-producing layer is further disposed on a top surface of the substrate; and
   the substrate includes the second semiconductor material, wherein a constituent concentration of the second semiconductor material of the substrate is different than a constituent concentration of the second semiconductor material of the fin structure.

3. The transistor of claim 2, wherein a thickness of the substrate is about 1 µm to about 3 µm and a thickness of the second semiconductor material of the fin structure is about 30 nm to about 100 nm.

4. The transistor of claim 1, wherein the isolation feature includes:
   a liner layer disposed over the strain-producing layer; and
   a fill layer disposed over the liner layer, wherein the liner layer does not physically contact a gate dielectric of the gate structure.

5. The transistor of claim 1, wherein:
   the isolation feature is disposed over a portion of the sidewalls of the first semiconductor material of the first portion of the fin structure; and
   the isolation feature is disposed over a portion of the sidewalls of the first semiconductor material of the second portions of the fin structure.

6. The transistor of claim 1, wherein a top surface of the second semiconductor material of the first portion of the fin structure and top surfaces of the second semiconductor material of the second potions of the fin structure are lower than a top surface of the isolation feature.

7. The transistor of claim 1, wherein a thickness of the first semiconductor material of the first portion of the fin structure is greater than a thickness of the first semiconductor material of the second portions of the fin structure.

8. The transistor of claim 1, wherein the strain-producing layer has curved surfaces.

9. A transistor comprising:
   a fin structure that includes a first portion defined between second portions, wherein the first portion and the second portions of the fin structure each include a first semiconductor layer that includes silicon disposed over a second semiconductor layer that includes silicon and germanium, and further wherein the second portions of the fin structure each further include a third semiconductor layer that includes silicon disposed over the first semiconductor layer;
   a high-k metal gate disposed over and wrapping an upper portion of the first semiconductor layer of the first portion of the fin structure, such that the high-k metal gate is disposed on sidewalls of the upper portion of the first semiconductor layer;
   a dielectric isolation feature disposed over sidewalls of a lower portion of the first semiconductor layer of the first portion of the fin structure, sidewalls of a lower portion of the first semiconductor layer of the second portions of the fin structure, sidewalls of the second semiconductor layer of the first portion of the fin structure, and sidewalls of the second semiconductor layer of the second portions of the fin structure; and
   a semiconductor oxide layer disposed between the dielectric isolation feature and the sidewalls of the second semiconductor layer of the first portion of the fin structure, wherein the semiconductor oxide layer includes silicon and germanium.

10. The transistor of claim 9, wherein the dielectric isolation feature includes a first dielectric layer disposed over a second dielectric layer, wherein a topmost surface of the second dielectric layer is lower than a topmost surface of the first dielectric layer.

11. The transistor of claim 10, wherein a distance between the topmost surface of the second dielectric layer and the topmost surface of the first dielectric layer is about 3 nm to about 10 nm.

12. The transistor of claim 9, wherein a thickness of the semiconductor oxide layer is about 3 nm to about 25 nm.

13. The transistor of claim 9, wherein the fin structure is disposed over a substrate that includes silicon and germanium, wherein a concentration of the germanium in the substrate is different than a concentration of the germanium in the second semiconductor layer.

14. The transistor of claim 13, wherein the concentration of the germanium in the substrate is about 10% to about 30% and the concentration of the germanium in the second semiconductor layer is about 15% to about 60%.

15. The transistor of claim 9, wherein a thickness of the lower portion of the first semiconductor layer of the first portion of the fin structure and the lower portion of the first semiconductor layer of the second portions of the fin structure is about 5 nm to about 25 nm.

16. A device comprising:
   a first transistor that includes:
      a first fin structure that includes a first portion defined between second portions, wherein the first portion and the second portions of the first fin structure each include a first semiconductor layer disposed over a second semiconductor layer, and further wherein the second portions of the first fin structure each further include a third semiconductor layer disposed over the first semiconductor layer, a first high-k metal gate disposed over and wrapping an upper portion of the first semiconductor layer of the first portion of the first fin structure, such that the first high-k metal gate is disposed on sidewalls of the upper portion of the first semiconductor layer, and a semiconductor oxide layer disposed over sidewalls of the second semiconductor layer of the first portion of the first fin structure;

a second transistor that includes:

a second fin structure that includes a third portion defined between fourth portions, wherein the third portion and the fourth portions of the second fin structure each include a fourth semiconductor layer disposed over a fifth semiconductor layer and a sixth semiconductor layer disposed over the fifth semiconductor layer, and further wherein the fourth portions of the second fin structure each further include a seventh semiconductor layer disposed over the sixth semiconductor layer, and a second high-k metal gate disposed over and wrapping an upper portion of the sixth semiconductor layer of the third portion of the second fin structure, such that the second high-k metal gate is disposed on sidewalls of the upper portion of the sixth semiconductor layer; and a dielectric isolation feature disposed over:

sidewalls of a lower portion of the first semiconductor layer of the first portion of the first fin structure, sidewalls of a lower portion of the first semiconductor layer of the second portions of the first fin structure, sidewalls of the second semiconductor layer of the first portion of the first fin structure, and sidewalls of the second semiconductor layer of the second portions of the first fin structure, and sidewalls of a lower portion of the sixth semiconductor layer of the third portion of the second fin structure, sidewalls of a lower portion of the sixth semiconductor layer of the fourth portions of the second fin structure, sidewalls of a lower portion of the fourth semiconductor layer of the third portion of the second fin structure, sidewalls of a lower portion of the fourth semiconductor layer of the fourth portions of the second fin structure, sidewalls of the fifth semiconductor layer of the third portion of the second fin structure, and sidewalls of the fifth semiconductor layer of the fourth portions of the second fin structure.

17. The device of claim 16, wherein the sixth semiconductor layer is disposed over sidewalls of an upper portion of the fourth semiconductor layer of the third portion of the second fin structure and sidewalls of an upper portion of the fourth semiconductor layer of the fourth portions of the second fin structure.

18. The device of claim 16, wherein the dielectric isolation feature includes a fill layer disposed over a liner layer, wherein a topmost surface of the liner layer is lower than a topmost surface of the fill layer.

19. The device of claim 18, wherein the liner layer disposed over the sidewalls of the lower portion of the first semiconductor layer of the first portion of the first fin structure and the sidewalls of the second semiconductor layer of the first portion of the first fin structure has a curvilinear profile.

20. The device of claim 16, further comprising a dielectric layer disposed over the dielectric isolation feature, wherein the dielectric layer is disposed:

over sidewalls of an upper portion of the first semiconductor layer of the second portions of the first fin structure;

between the dielectric isolation feature and the sidewalls of the lower portion of the first semiconductor layer of the second portions of the first fin structure;

over sidewalls of a lower portion of the third semiconductor layer of the second portions of the first fin structure;

over sidewalls of an upper portion of the sixth semiconductor layer of the fourth portions of the second fin structure; and over sidewalls of a lower portion of the seventh semiconductor layer of the fourth portions of the second fin structure.

* * * * *